(12) United States Patent
Hallak

(10) Patent No.: US 8,587,289 B2
(45) Date of Patent: Nov. 19, 2013

(54) METHOD FOR DETERMINING THE OFFSET OF A PERIODIC SIGNAL

(75) Inventor: Jalal Hallak, Vienna (AT)

(73) Assignee: Siemens Aktiengesellschaft, München (DE)

( * ) Notice: Subject to any disclaimer, the term of this patent is extended or adjusted under 35 U.S.C. 154(b) by 422 days.

(21) Appl. No.: 12/993,286

(22) PCT Filed: May 11, 2009

(86) PCT No.: PCT/EP2009/055636
§ 371 (c)(1),
(2), (4) Date: Nov. 18, 2010

(87) PCT Pub. No.: WO2009/144129
PCT Pub. Date: Dec. 3, 2009

(65) Prior Publication Data
US 2011/0068770 A1    Mar. 24, 2011

(30) Foreign Application Priority Data
May 30, 2008 (AT) .................................. A 878/2008

(51) Int. Cl.
*G01R 25/00* (2006.01)
(52) U.S. Cl.
USPC .................... 324/76.77; 324/73.1; 324/91
(58) Field of Classification Search
None
See application file for complete search history.

(56) References Cited

U.S. PATENT DOCUMENTS

| | | | |
|---|---|---|---|
| 4,109,308 A | | 8/1978 | Rodel |
| 4,363,977 A | * | 12/1982 | Tsuda et al. .................... 327/73 |
| 4,878,026 A | | 10/1989 | Moreau et al. |
| 5,452,198 A | | 9/1995 | Jessee |
| 6,282,228 B1 | * | 8/2001 | Monroe ........................ 375/140 |
| 2005/0271163 A1 | | 12/2005 | Hjelm |

FOREIGN PATENT DOCUMENTS

| | | |
|---|---|---|
| AT | 408393 B | 11/2001 |
| CN | 1625833 A | 6/2005 |
| DE | 2454601 A1 | 5/1976 |
| DE | 2626927 A1 | 12/1977 |
| DE | 3900796 A1 | 7/1990 |
| JP | 57048826 A | 3/1982 |
| WO | WO 2005029691 A1 | 3/2005 |

* cited by examiner

*Primary Examiner* — Minh N Tang

(57) ABSTRACT

A method for determining an offset of a periodic signal is provided, wherein an offset value caused by a level change of the periodic signal is suppressed. The periodic signal is fed to first and second integrators and to a periodicity recognition unit, wherein the first integrator is integrated over a full period. The second integrator is integrated over a full period offset by a half period. Starting times of integrations are controlled by the periodicity recognition unit. Output signals of the integrators are stored in two memories, wherein the output signals are summed and a sum signal represents the offset of the periodic signal. The output signals are fed to a comparator circuit. The sum signal is stored in a further memory as an output signal, wherein the comparator circuit triggers the further memory to continue outputting a value of the output signal stored in the further memory.

4 Claims, 25 Drawing Sheets

FIG 4
(Prior Art)
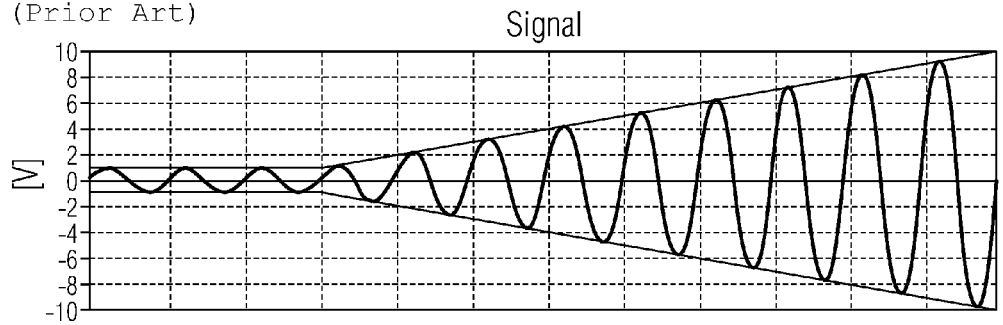
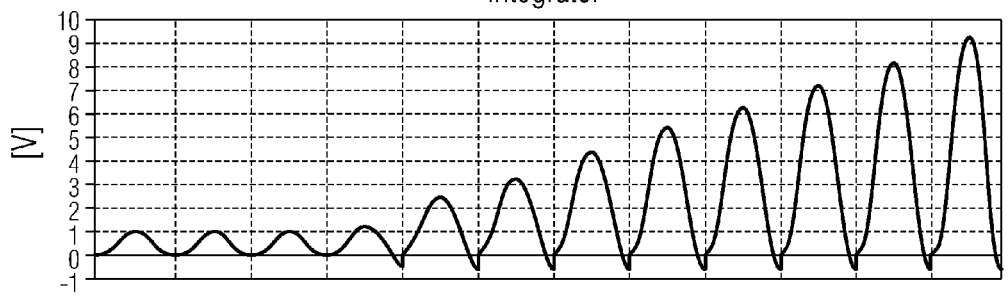
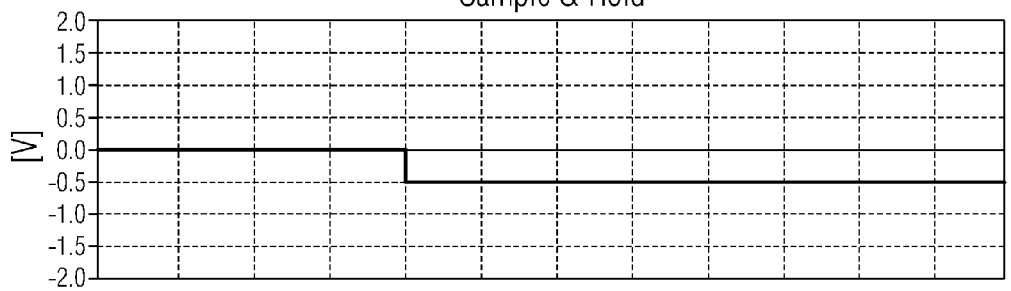

FIG 5
(Prior Art)
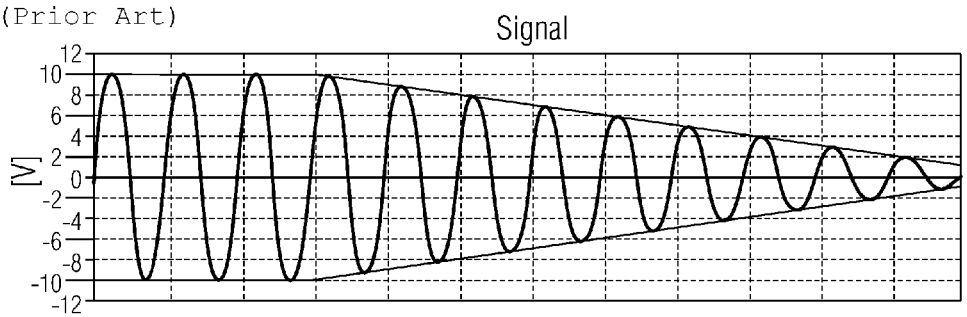
Signal
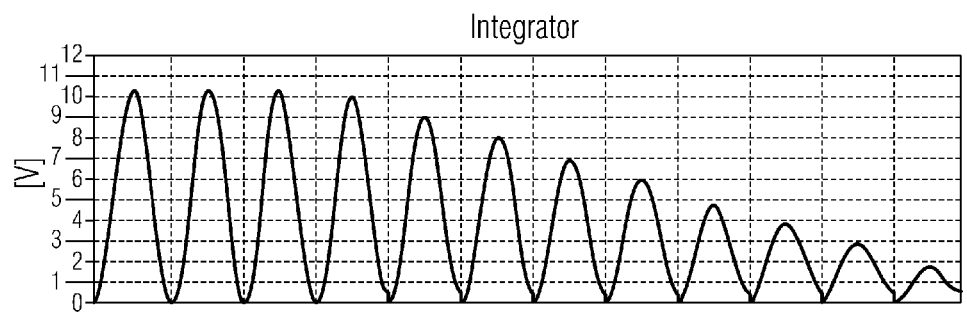
Integrator
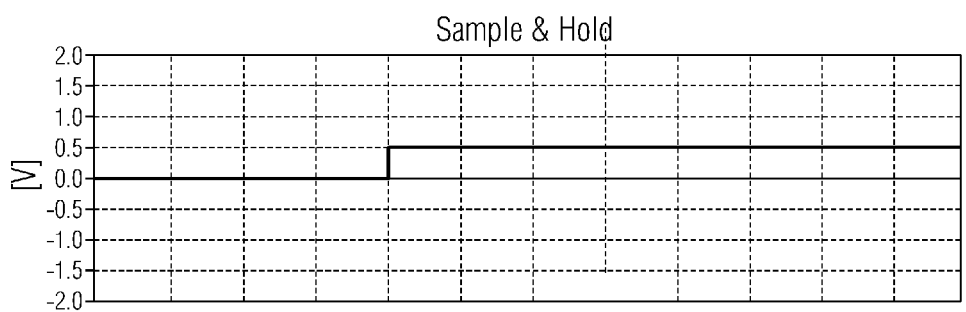
Sample & Hold FIG 6
(Prior Art)
Signal
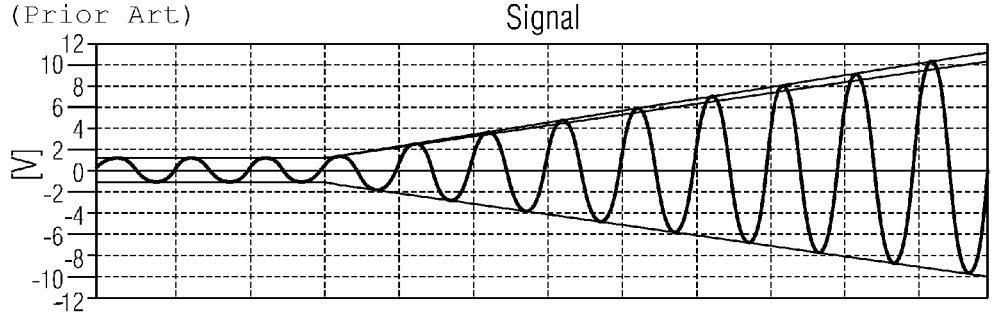
Integrator
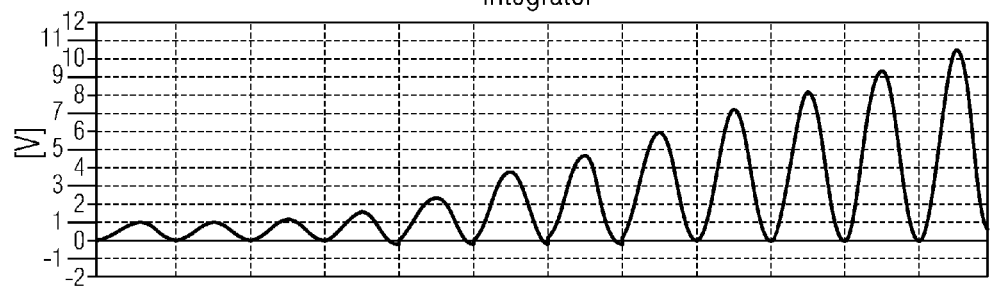
Sample & Hold
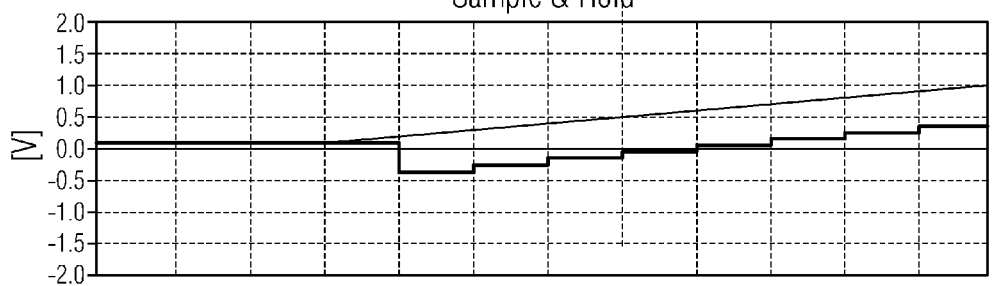

METHOD FOR DETERMINING THE OFFSET OF A PERIODIC SIGNAL

CROSS REFERENCE TO RELATED APPLICATIONS

This application is the US National Stage of International Application No. PCT/EP2009/055636 filed. May 11, 2009, and claims the benefit thereof. The International Application claims the benefits of Austrian Application No. A878/2008 AT filed May 30, 2008. All of the applications are incorporated by reference herein in their entirety.

TECHNICAL FIELD

The invention relates to a method for determining the offset of a periodic signal.

PRIOR ART

The offset $\bar{u}$ (offset value) of a periodic signal u is calculated in accordance with:

$$\bar{u} = \int_0^T u\, dt$$

as an integral over a period of time T of the signal u. Accordingly a signal does not contain an offset component when the positive and negative signal time surfaces cancel each other out over the duration of a period of time. This is represented by the case of a so-called alternating current.

In technical applications determining the offset of a signal is a frequent problem. This problem is frequently resolved by using a method which, instead of an integration, uses summing for offset determination.

The offset u is determined in accordance with:

$$\bar{u} = \Sigma u(t) \Delta t$$

with the continuous integration of the signal $\bar{u}$ over a period of time T devolving into a summing of the signal time increment sections $u(t)*\Delta t$.

One of the variables on which the accuracy of an offset determination according to this method depends is the size of the time increment $\Delta t$, with the aim being to obtain the smallest possible time increments $\Delta t$.

A method frequently used for offset determination integrates (sums) the input signal over a full period of time T by means of an integrator. The value stored after a full period of time T in the integrator represents the offset of this period. At the time at which the next period begins the integrator is reset (the stored value is deleted) and the measurement is started anew. With this method the offset of each individual period is determined.

If the amplitude of the signal for which the offset is to be determined changes during the determination (is increased or reduced), this offset determination method still shows an offset during the amplitude change however, since in this case each subsequent half-wave in time has a larger (or smaller) amplitude than the previous half wave with opposite polarity. The positive and negative half waves are not equal in each case during the amplitude change, so that in the case of an amplitude increase, a negative offset and in the case of an amplitude reduction a positive offset are determined by this offset determination method, depending on the point in time of the half period (positive or negative) at which the rise or the fall of the signal level begins. This offset only occurring during the amplitude change can have a disadvantageous effect for specific closed-loop control systems, especially for applications in inverter technology. In inverter technology influencing of the offset of the output signal is among the uses of closed-loop control circuits of which the control speeds are so high that even offsets occurring during just a few periods (typically of 50 Hz or 60 Hz ac mains voltage) initiate a control process which can lead to undesired oscillations of the closed-loop control circuit.

PRESENTATION OF THE INVENTION

An object of the invention is thus to specify a method for determining the offset of a periodic signal which compensates for the offset arising during the change in the amplitude of a periodic signal.

The object is achieved by a method according to the independent claim. Advantageous embodiments are the subject of dependent claims.

According to the basic idea of the invention, the offset of a signal will be determined by addition of the output signals of two integrators which both process the signal of which the offset is to be identified and whereby one integrator is integrated over a full period in each case and the second integrator is integrated over a full period displaced by a half period.

To this end the signal of which the offset is to be determined is fed both to the inputs of the two integrators and also to a periodicity recognition facility. This periodicity recognition facility determines the beginning and the end times of each individual period of the signal and controls one of the two integrators in such a manner that this integrator integrates the signal in each case over a full period of the signal (from the begin time of the period to the end time of the period). This periodicity recognition controls the second integrator in such a manner that this second integrator integrates the signal over a full period duration, but displaced by a half wave.

What is referred to as a zero crossing detection can typically be included for periodicity recognition.

This allows the advantage to be achieved that the offset occurring in the event of the amplitudes of the signal changing is compensated for and only the offset of the signal is determined which is also determined with a constant amplitude by the integral method.

The major advantage of the inventive method lies in the fact that closed-loop controls based on determining the offset (especially in current converter or rectifier applications) are no longer subjected to adjustments for offset values occurring for short-duration amplitude changes which are not necessary and which can lead to oscillations of the closed-loop control circuit.

The inventive method is especially advantageous for use with sine-wave signals, since with sine-wave signals the period duration (or the beginning and end of the period) can be recognized especially easily.

It is possible to use the inventive method with any given periodic signals, but the detection of the periodicity of the signal is to be matched to the respective signal.

The inventive method is suitable on the one hand for the actual construction of an electronic circuit for executing the method by means of discrete components, on the other hand for realization by means of software, with the continuous integration naturally merging into the processing of temporally discrete signal values. Even for realization by means of software, the suitable selection of the sampling frequency enables a solution equivalent to the discrete form of embodiment to be achieved. Any given mixed forms of discrete electronic components and software are likewise possible.

The hardware design of a circuit executing the inventive method, in addition to the components described (integrators, periodicity detection, summation), must also include modules which reset the integrators again in each case after an integration process and briefly store (Sample&Hold) the integration result (generally represented as a voltage level).

The inventive method generates an output signal which represents the offset of the input signal, whereby in the event of rising or falling amplitude of the input signal, no offset caused by this amplitude change is indicated. However a condition of the inventive method is that, at the beginning of the amplitude change for the time of a half period an offset is indicated, since the second integrator acts offset in time by a half period.

A further embodiment of the invention therefore makes provision for the signal formed by addition of the output signals of the two integrators representing the offset of the input signal to the stored on detection of an amplitude change in a memory device and for it to continue to be regarded for a specific period of time as a valid output signal. To this end the stored output signals of the two integrators (after a full period in each case) are compared with one another by means of a comparison facility (comparator). If there is a difference an amplitude change of the input signal has occurred in the last measurement time (period duration). The comparator, on detection of an amplitude change, activates a timer (Mono Flip flop). This timer activates the memory device for a period specified by this timer in a manner such that the memory device keeps the value stored within it (which represents the last specified value of the offset of the input signal) constant for this period as an output value.

This advantageously allows the fluctuations occurring erroneously of the offset determined to be kept away from a closed loop control circuit and this control circuit thereby not being caused to make unnecessary changes to manipulated variables.

A further method (half-wave integration) is known from the prior art which provides for using only one integrator, whereby both half waves (positive and negative half wave) are integrated separately by this one integrator and the result of the first (for example positive) half wave is stored in a memory device (Sample & Hold) until the result of the second half wave is determined and likewise has been stored in a further memory device. Subsequently the results stored in the two memory devices are added to one another and thus the offset of the entire period is determined. This method determines the offset more quickly by one half period than a method with an integrator which integrates the entire period. This method likewise shows an alternating offset during the amplitude change.

A further form of embodiment of the inventive method develops this half-wave integration method further, with two additional memory devices (Sample & Hold) being provided, which each receive the output signal of one half-wave integration method as their input signal and one of these memory devices detects and stores the input signal with a delay of between zero and a quarter of the period duration and the second of these memory devices detects and stores the input signal with a delay of between a quarter and half of the period duration. The output signal representing the offset of the signal to be investigated is formed by means of summation from the output signals of the two (additional) memory devices.

The advantage able to be obtained by this method is on the one hand of being able to employ the half-wave integration method for determining the offset more quickly and also of not getting any alternating offset during amplitudes changes and having to make a change to the manipulated variable based on closed loop control of this measured value.

This improved half-wave integration method requires however that at the beginning of the amplitude change an offset be indicated for the duration of a half period. In a further embodiment of the invention there is therefore provision for storing the signal formed by addition of the output signals of the two (additional) memory devices representing the offset of the input signal in a further memory device on detection of an amplitude change and continuing to regard it for a specific period of time as a valid output signal. To this end the stored output signals of the two memory devices (after a full period in each case) are compared with one another by means of a comparison facility (comparator). If there is a difference, an amplitude change of the input signal has occurred during the last measurement time (period duration). On detecting an amplitude change, the comparator activates a timer (Mono Flip Flop). This timer activates the memory device for a period determined by this timer in a manner such that the memory device keeps the value stored within it (which represents the last value of the offset of the input signal determined) constant for this period of time as an output value.

The advantage able to be achieved by this is that erroneously occurring fluctuations of the offset determined are kept away from closed loop control circuit and this closed loop control circuit is thus not caused to make unnecessary manipulated variable changes, whereby the advantage of the rapidly reacting half-wave integration method is preserved.

It is further advantageous to execute the inventive method by means of a computer, especially by means of a so-called microcontroller. The modules executing the method are well suited to being implemented by means of a microcontroller since especially the integrators and memory devices (Sample&Hold) used in this embodiment do not exhibit the otherwise unavoidable tolerances and signal losses.

BRIEF DESCRIPTION OF THE DRAWINGS

The figures show the following typical examples:

FIG. 4 shows a simulation of the signal curves in an offset determination circuit according to an integration method for an input signal with rising amplitude.

FIG. 5 shows a simulation of the signal curves in an offset determination circuit according to an integration method for an input signal with falling amplitude.

FIG. 6 shows a simulation of the signal curves in an offset determination circuit according to an integration method for an input signal with rising amplitude and offset.

EMBODIMENT OF THE INVENTION

The signal curves shown in the figure are typical curves for explaining the inventive method, in particular the voltage values specified in the signal curves serve exclusively to make the explanations easier to understand. In all figures which show signal curves the horizontal axis represents the time. The inventive method is applicable for any given levels and frequencies of the input signal.

Figure 1:
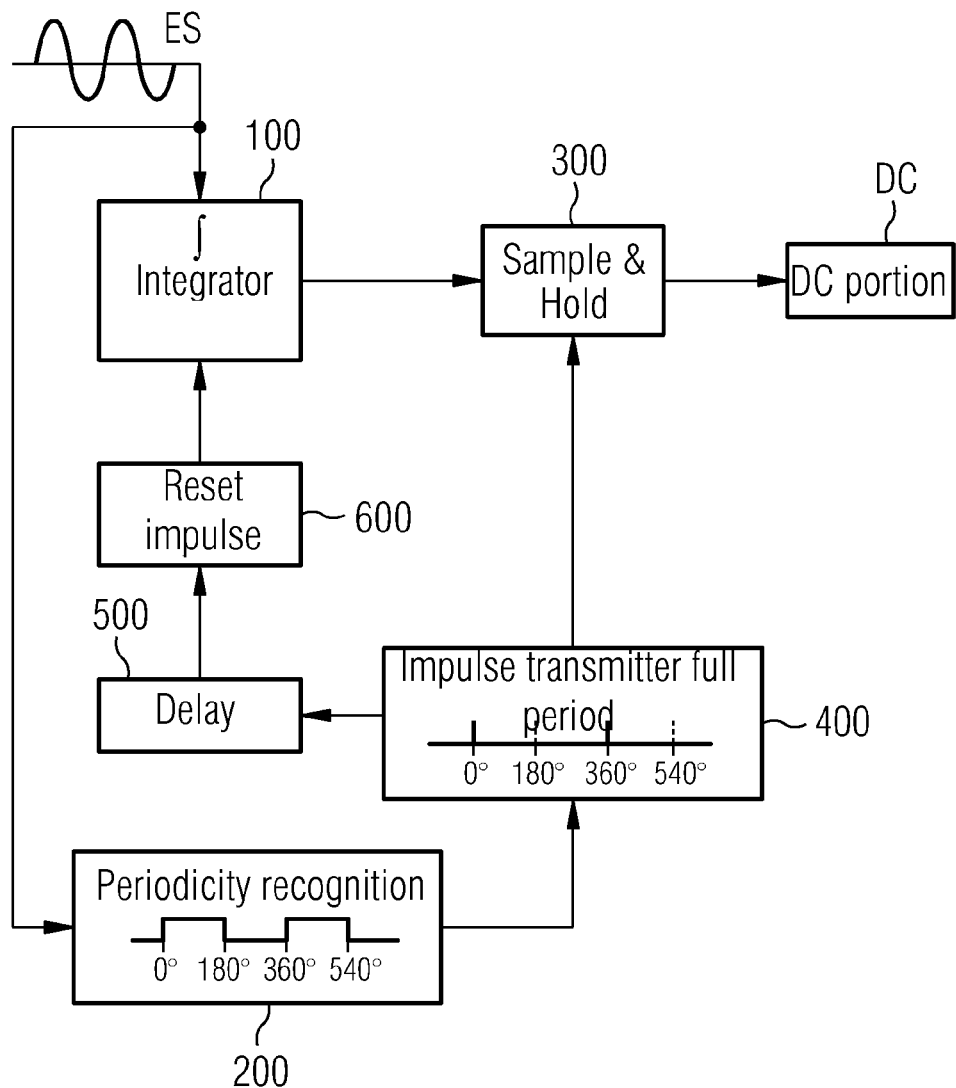
FIG. 1 shows a block diagram of an offset determination circuit according to the integration method.

FIG. 1 shows a typical schematic block circuit diagram of an offset determination circuit according to the integration method as is known from the prior art. An input signal ES is supplied to the inputs of an integrator 100 and a periodicity recognition unit 200. The periodicity recognition unit 200 recognizes the beginning of each individual period of the input signal ES and activates by means of an impulse transmitter 400 at the time of the beginning of each period a memory device 300 which stores the level output at this point in time that the output of the integrator 100 which represents the offset of the last elapsed period of the input signal ES and holds it as an output signal DC.

The impulse transmitter 400 activates a delay circuit 500 at the point in time at which each full period begins, which by means of a trigger circuit 600 resets (clears) the integrator 100 immediately after the storage of the output level of the integrator 100 in the memory device 300. The pulses for activating the memory device 300 and the pulses for resetting the integrator 100 are thus directly consecutive in time.

Figure 2:
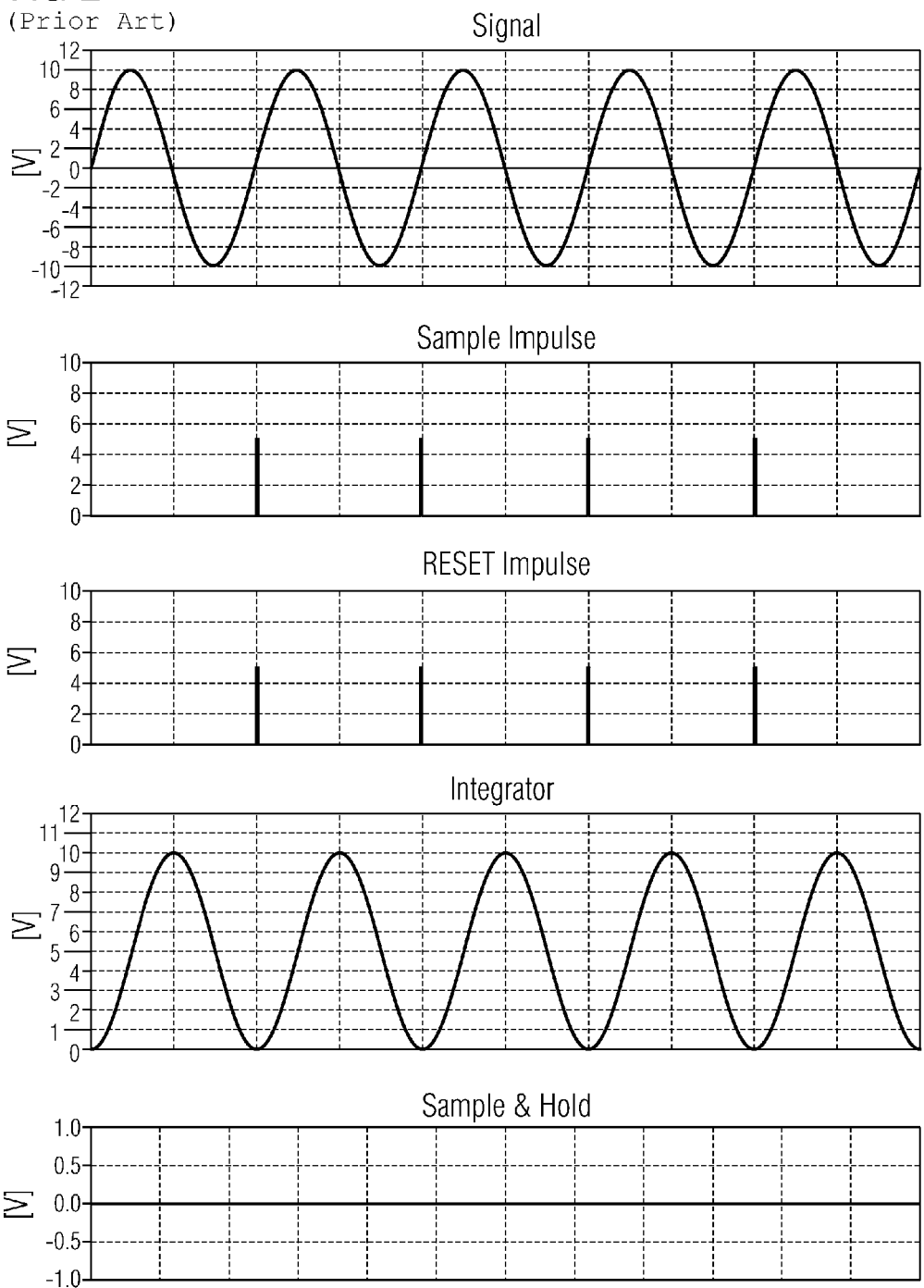
FIG. 2 shows a simulation of the signal curves in an offset determination circuit according to an integration method for an input signal without offset.

FIG. 2 shows a typical schematic diagram of simulation of the signal curves in an offset determination circuit according to FIG. 1. A sinusoidal signal without offset ES forms the output signal of the integrator 100 and is integrated by this integrator 100 over one period in each case. The output signal of the integrator 100 forms the input signal of a memory device 300 which, at times determined by the signal Sample Impulse, stores the output signal of the integrator 100 and for its part makes it available as output signal DC (Sample&Hold). Also shown in FIG. 2 are the signal for controlling the memory device 300 (Sample Impulse) and the signal for resetting the integrator 100 (RESET Impulse). The output signal of the memory device DC (Sample&Hold) representing the offset of the input signal assumes the values zero at each point in time in the example shown.

Figure 3:
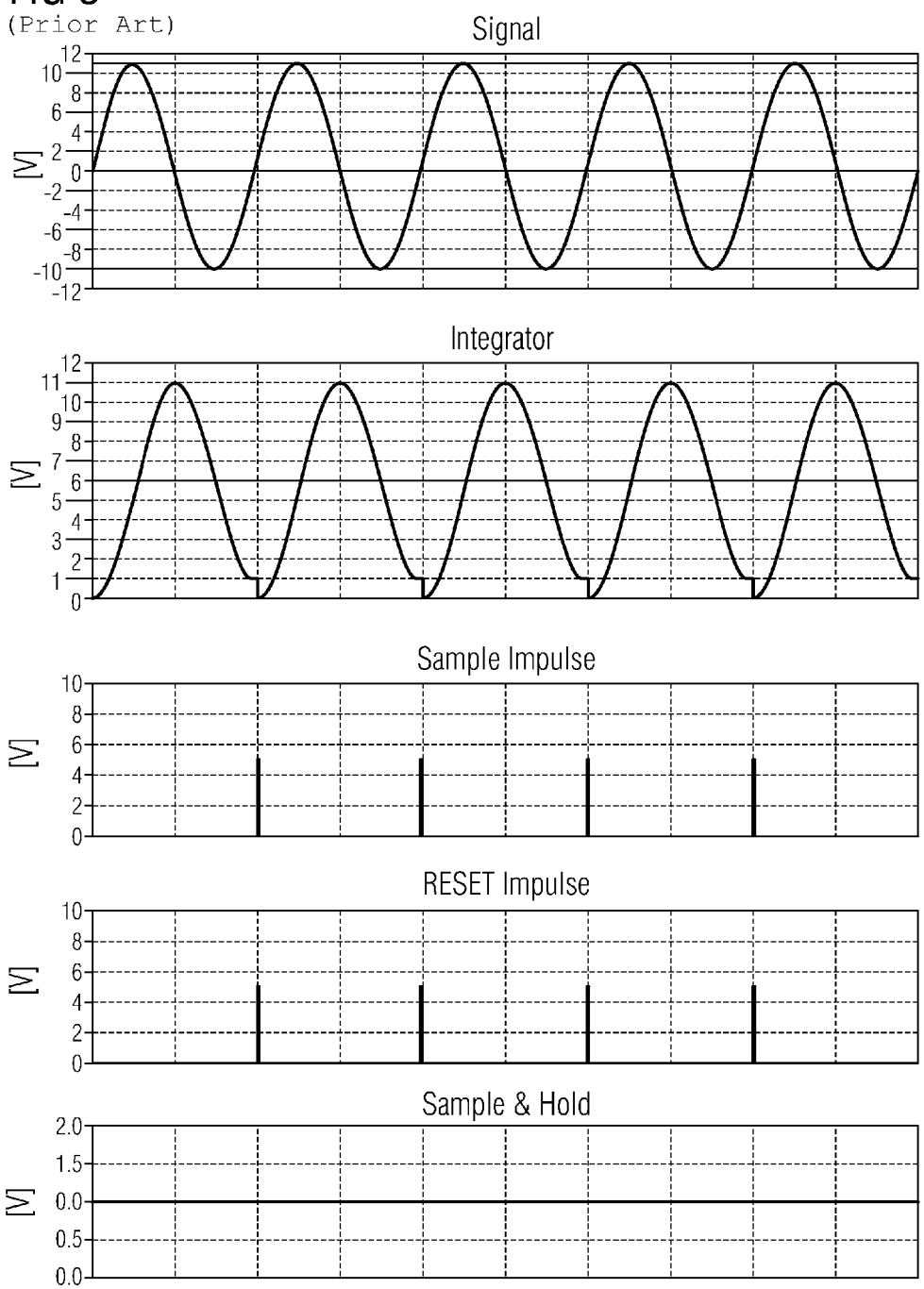
FIG. 3 shows a simulation of the signal curves in an offset determination circuit according to an integration method for an input signal with offset.

FIG. 3 shows a typical schematic diagram of the simulation of the signal curves in an offset determination circuit according to FIG. 1 for a sinusoidal input signal ES with a positive offset. In the example shown, at the time of the end of each period of the input signal, a positive value is present at the output of the integrator 100 which is stored by the memory device 300.

FIG. 4 shows a typical schematic diagram of the simulation of the signal curves in an offset determination circuit according to FIG. 1 for a sinusoidal input signal ES without offset with rising amplitude. A sinusoidal input signal ES is shown which exhibits a level rising at a constant rate as from a point in time. This means that, as from this point in time, each half period possesses a greater amount of amplitude than the previous half period. Thus the integrator 100 integrates a signal of which the first half period features a small amount than the second half period with opposing polarity. In the concrete example this means that, as from the point in time of the rise of the level of the input signal, a negative value is set at the output of the integrator 100.

The signals for activating the memory device 300 and the signals for resetting integrator 100 are no longer shown in the diagram for reasons the simplification.

FIG. 5 shows a typical schematic diagram of the simulation of the signal curves in an offset determination circuit according to FIG. 1 for a sinusoidal input signal ES without offset with falling amplitude.

In this case, as from the point in time of the fall in the level of the input signal ES, a positive value is set at the output of the integrator 100 and thus also as the offset DC.

FIG. 6 shows a typical schematic diagram of the simulation of the signal curves in an offset determination circuit according to FIG. 1 for a sinusoidal input signal ES with an offset and with rising amplitude. An input signal ES is shown which exhibits an offset of 10% of the amplitude and, as from a point in time exhibits a level increasing at a constant rate. With this input signal ES the offset determination circuit according to FIG. 1 creates an output signal DC which, at the point in time of the increase in level, corresponds to the offset of the input signal ES. At the point in time of the beginning of the increase in level in the example shown the output signal DC falls to negative values and increases thereafter after each full period.

Figure 7:
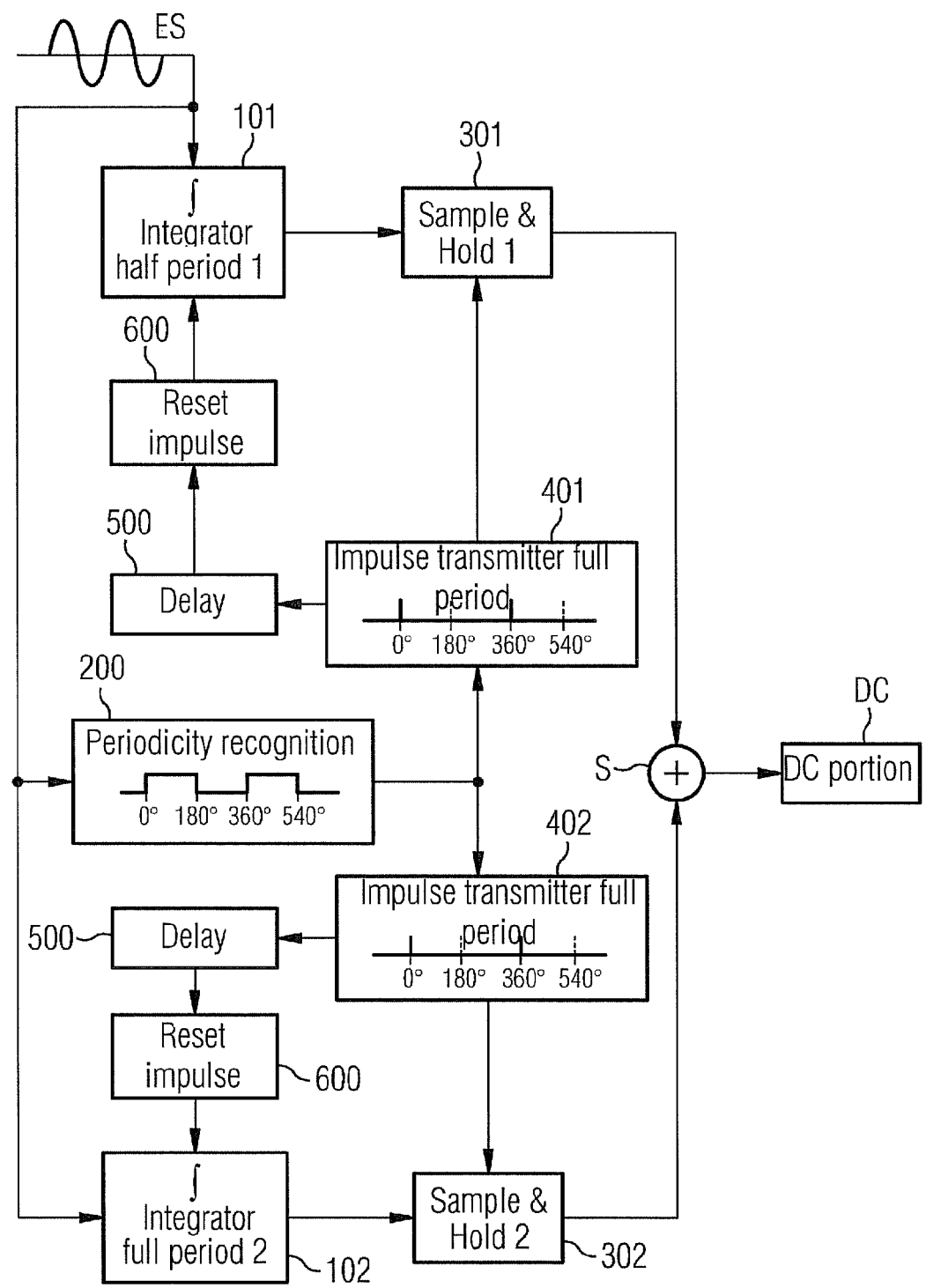
FIG. 7 shows a block diagram of an inventive offset determination circuit with two integrators operating offset by one half period to each other in each case.

FIG. 7 shows a typical schematic block circuit diagram of an offset determination circuit with two integrators operating offset in time from each other by one half period respectively.

An input signal ES of which the offset is to be determined is supplied both to the inputs of the two integrators 101, 102 and also to a periodicity recognition unit 200. This periodicity recognition unit 200 determines the beginning and end times of each individual period of the input signal ES and activates by means of two impulse transmitters 401, 402 the two integrators 101, 102 and two memory devices 301, 302 in such a way that one of these integrators 101, 102 integrates the input signal ES in each case over a full period of the input signal ES (from the point in time at which the period begins to the point in time at which it ends) and the other of the two integrators 101, 102 likewise integrates the input signal ES over a full period of the signal, but offset in time by a half period.

The two memory devices 301, 302 store the level output at the output of the integrator 101, 102 assigned to them at the points in time predetermined in each case by the respective impulse transmitter full period 401, 402. These two levels stored in the two memory devices 301, 302 are added by means of a summation circuit S and this summation level represents the offset DC of the input signal ES.

The resetting (clearing) of the two integrators 301, 302 is undertaken as in the circuit shown in FIG. 1.

Figure 8:
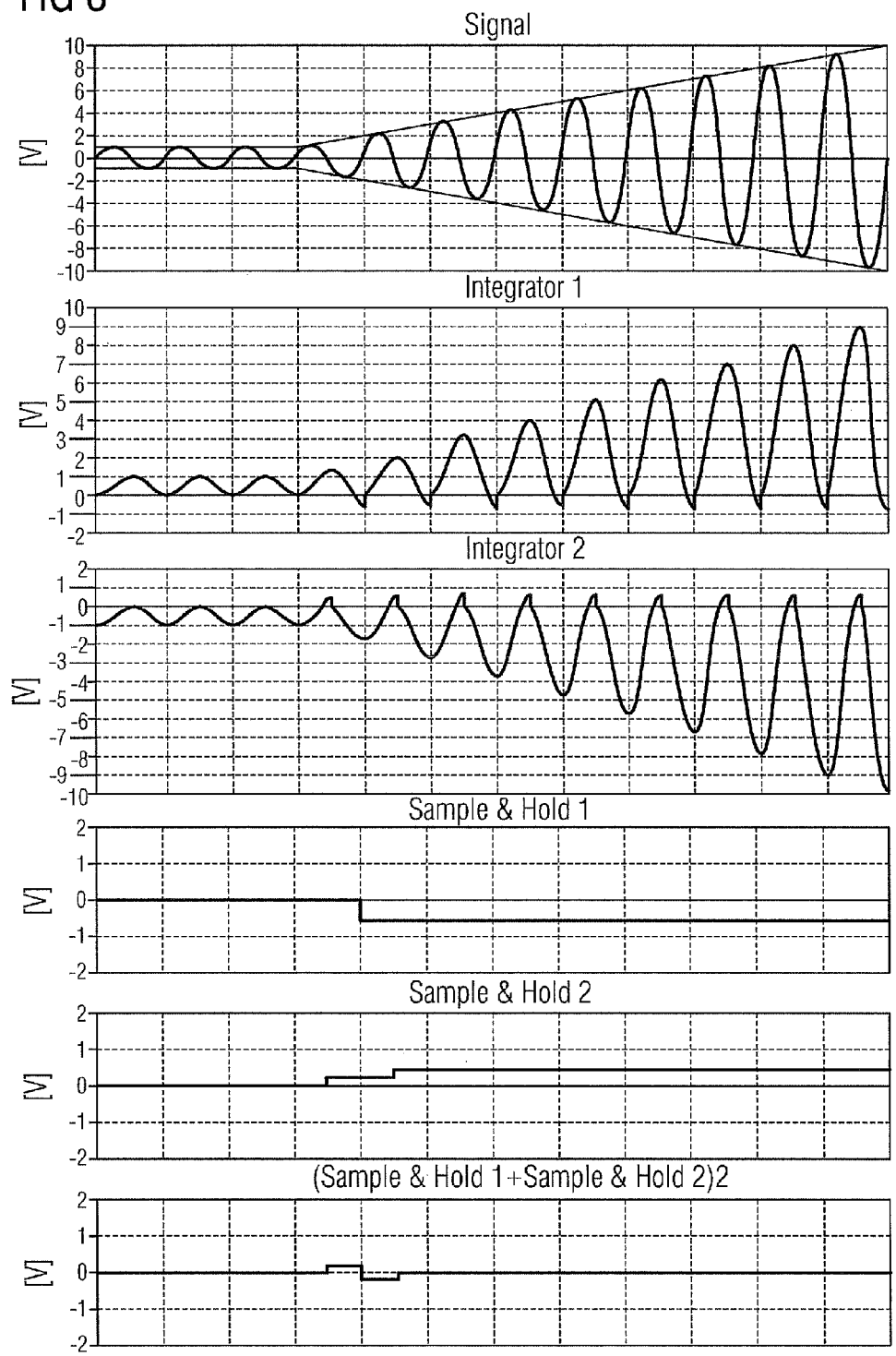
FIG. 8 shows a simulation of the signal curves in an offset determination circuit according to the method shown in FIG. 7 for an input signal with rising amplitude.

FIG. 8 shows a typical schematic diagram of the simulation of the signal curves in an offset determination circuit according to FIG. 7 for a sinusoidal input signal ES without offset with rising amplitude.

The output signals of the two integrators 301, 302 show the same signal curve, but are however offset in time by a half period from one another and inverted. The two signals Sample&Hold1 and Sample&Hold2 are added in a summation circuit S and form the output signal DC, which even in the event of input signals ES with rising amplitude, no longer has an offset after a synchronization time.

Figure 9:
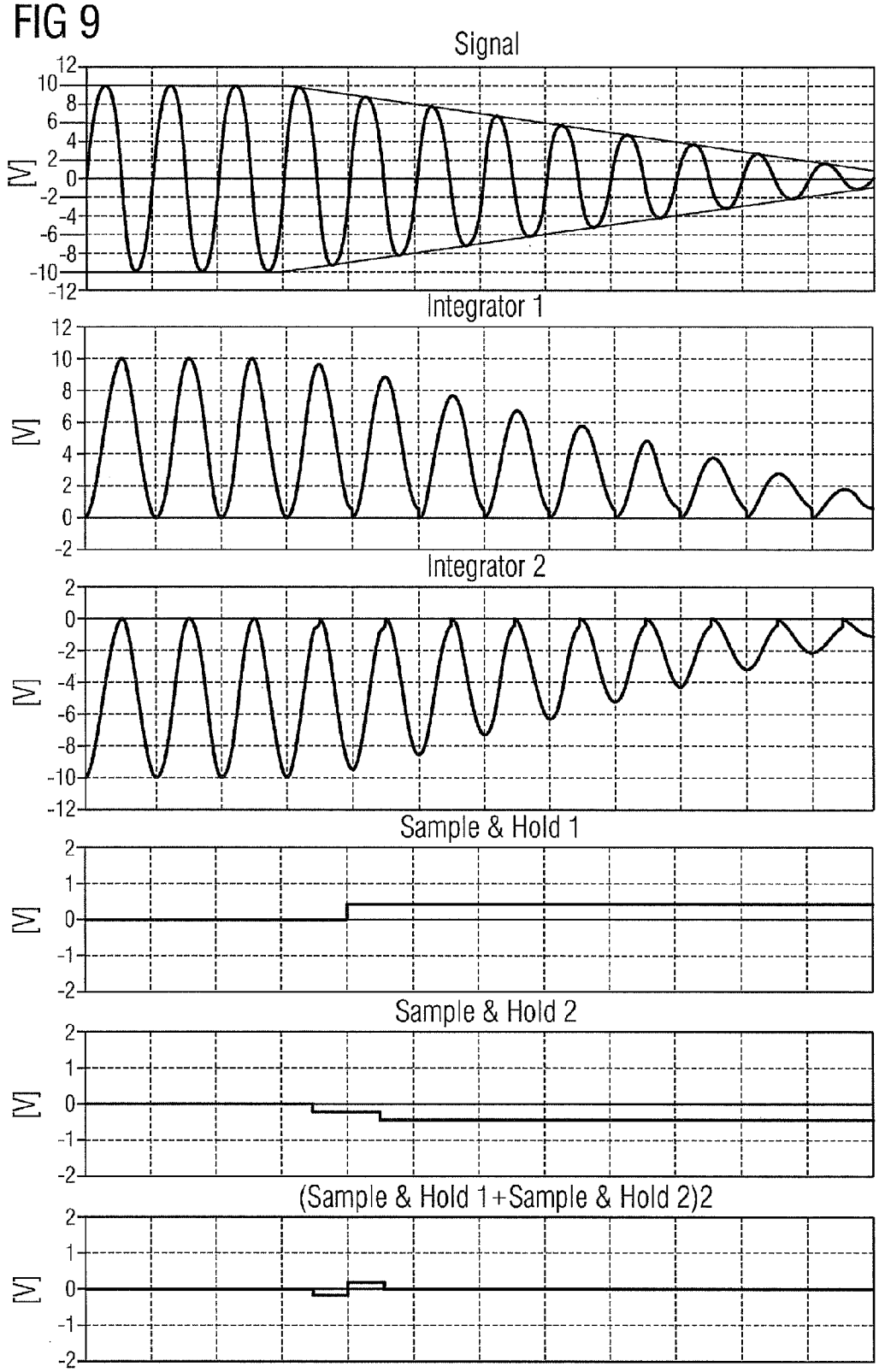
FIG. 9 shows a simulation of the signal curves in an offset determination circuit according to the method shown in FIG. 7 for an input signal with falling amplitude.

FIG. 9 shows a typical schematic diagram of the simulation of the signal curves in an offset determination circuit according to FIG. 7 for a sinusoidal input signal ES without offset with falling amplitude.

In this case output signal DC which exhibits no offset also arises after a synchronization time.

Figure 10:
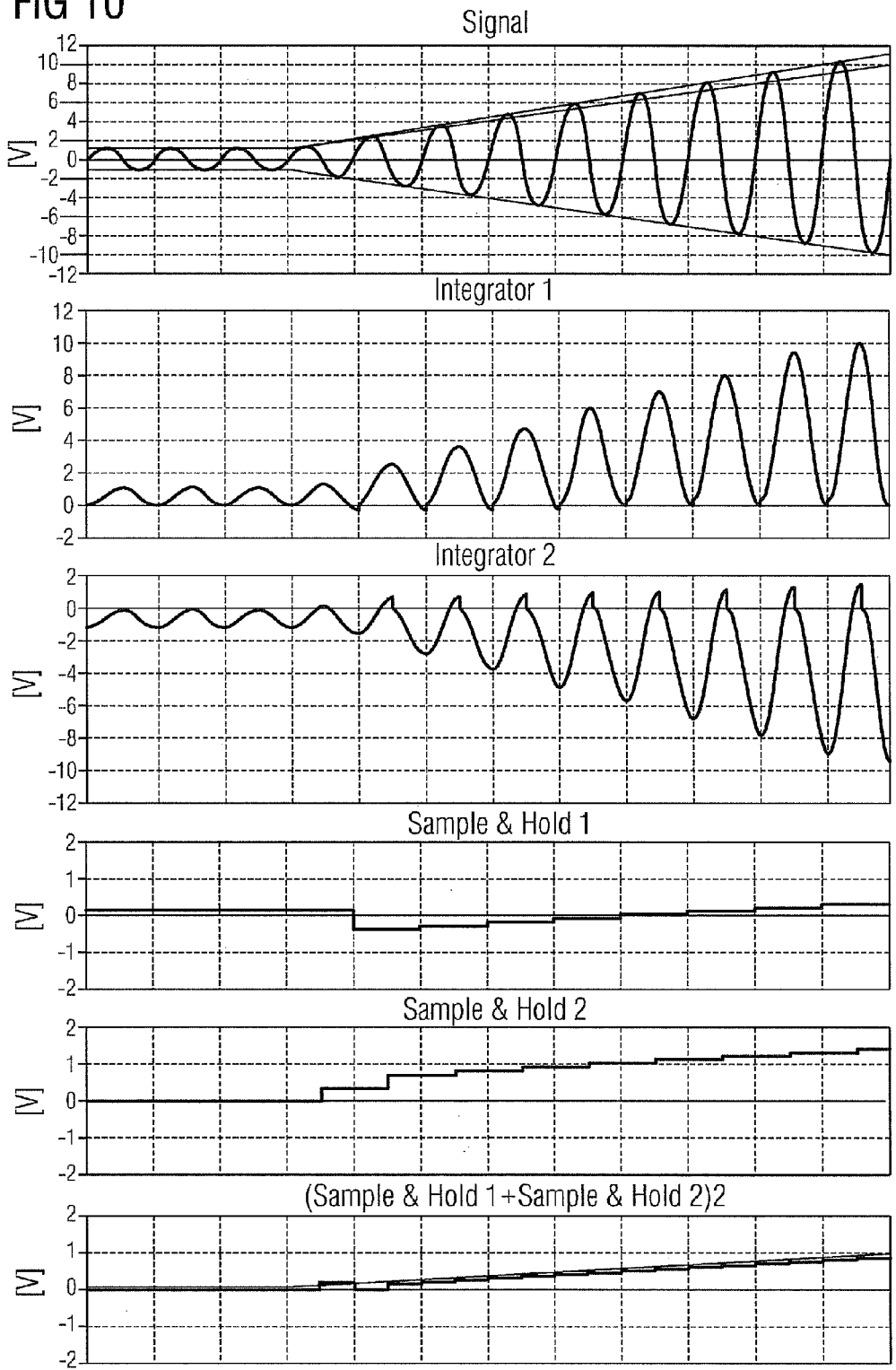
FIG. 10 shows a simulation of the signal curves in an offset determination circuit according to the method shown in FIG. 7 for an input signal with rising amplitude and offset of 10% of the amplitude.

FIG. 10 shows a typical schematic diagram of the simulation of the signal curves in an offset determination circuit according to FIG. 7 for an input signal ES with rising amplitude and an offset of 10% of the amplitude. An input signal ES is shown which has an offset of 10% of the amplitude and as from a point in time has a level rising at a constant rate.

The offset determination circuit according to FIG. 7 delivers as an output signal DC (sum of the two levels stored in the memory circuits 302, 302 (Sample&Hold 1 and Sample&Hold2)) a signal, which up to the point in time of the increasing level of the input signal ES, corresponds to the offset of the input signal ES and as from the point in time of the level increase of the input signal ES, after a synchronization time likewise corresponds to the offset DC of the input signal ES. In the diagram of this output signal the curve of the offset of the input signal (10% of the amplitude) is shown in FIG. 10. The output signal of the inventive circuit corresponds, except for the period of the synchronization process, to this offset.

Figure 11:
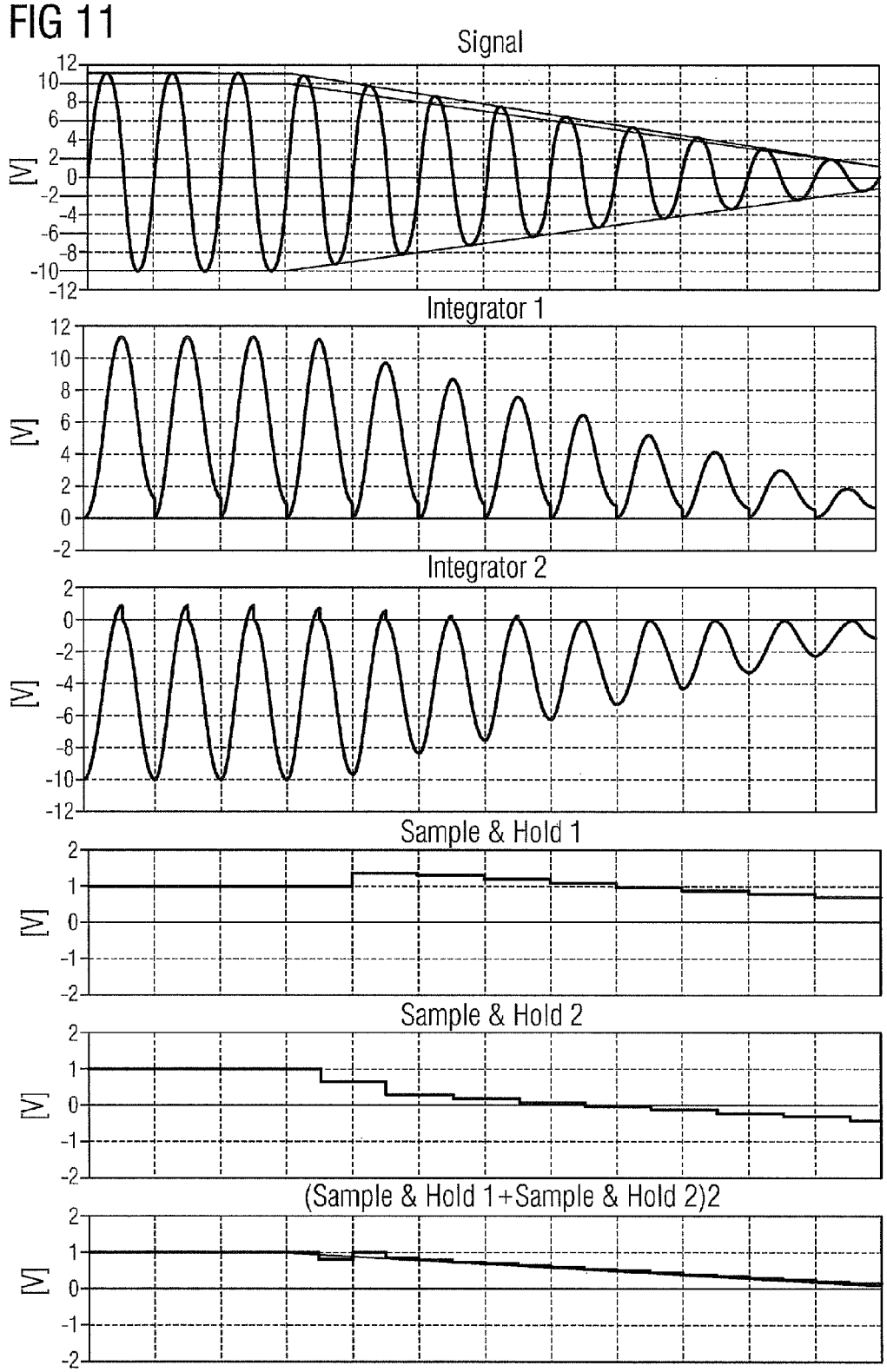
FIG. 11 shows a simulation of the signal curves in an offset determination circuit according to the method shown in FIG. 7 for an input signal with falling amplitude and offset of 10% of the amplitude.

FIG. 11 shows a typical schematic diagram of the simulation of the signal curves in an offset determination circuit according to FIG. 7 for an input signal ES with falling amplitude and an offset of 10% of the amplitude. An input signal is shown which exhibits an offset of 10% of the amplitude and as from a point in time represents a level falling at a constant rate.

In this case the output signal behaves in a way equivalent to the case shown in FIG. 10.

Figure 12:
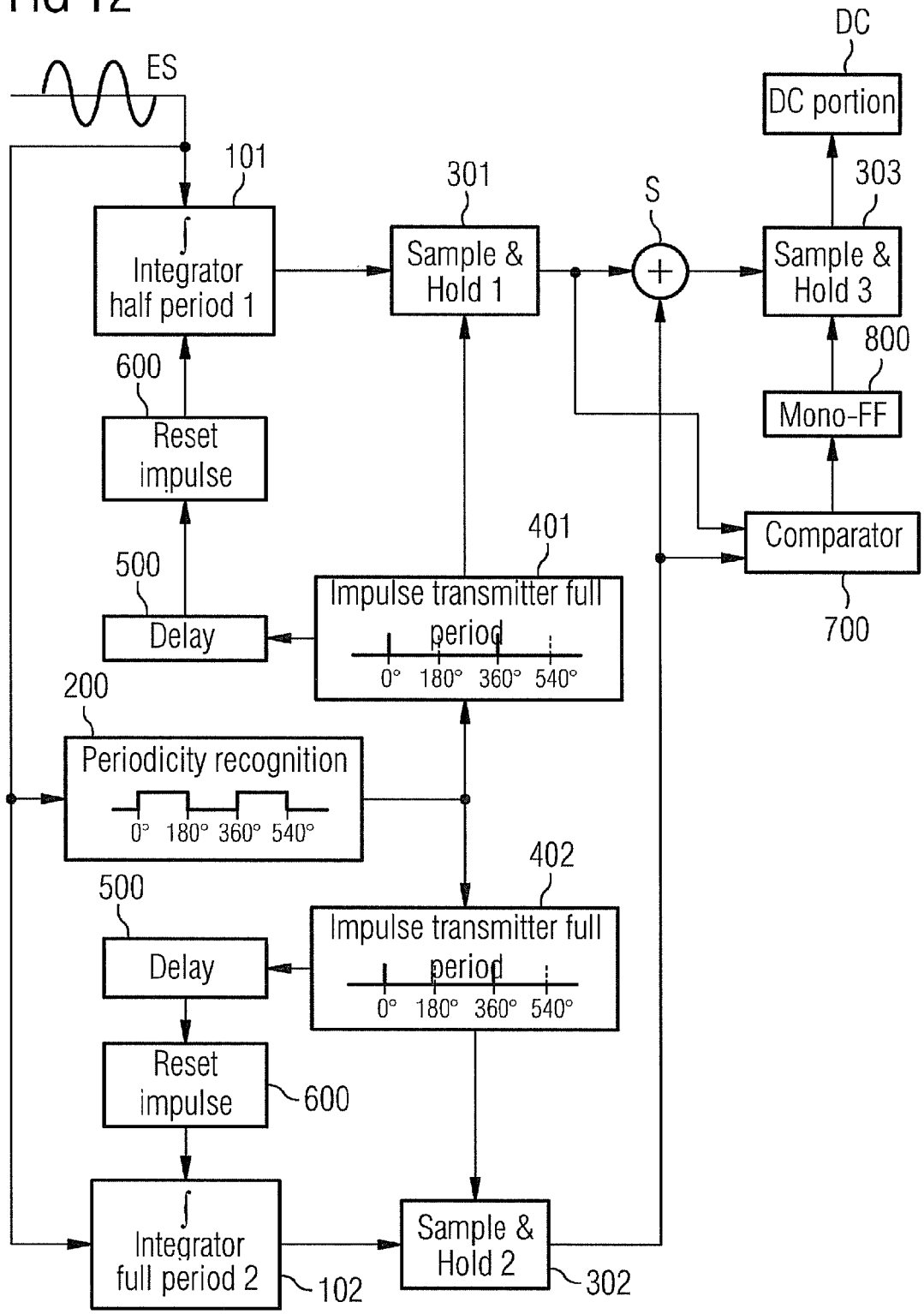
FIG. 12 shows a block diagram of an inventive offset determination circuit as in FIG. 7, expanded by means for suppressing the synchronization impulse.

FIG. 12 shows a typical schematic diagram of an offset determination circuit with two integrators operating offset in time by a half period in relation to one another in each case and suppression of the synchronization phase.

The circuit shown in FIG. 12 corresponds to the circuit shown in FIG. 7 and is expanded by means for suppressing the synchronization phase (synchronization impulse). To this end the signal formed by addition of the output signals of the two integrators 301, 302, representing the offset of the input signal, is stored on recognition of an amplitude change in a further memory unit 303 (Sample&Hold 3) and continues to be output for the period of the synchronization process as the output signal DC representing the offset of the input signal. A comparator device 700 compares the output level of the two memory units 301, 302 with one another and, in the event of a difference being present, activates a timer 800 (Mono Flip Flop), which causes the third memory unit 303, for a period of time determined by this timer 800, to continue to output the value stored in this third memory unit 303 as output signal DC.

Figure 13:
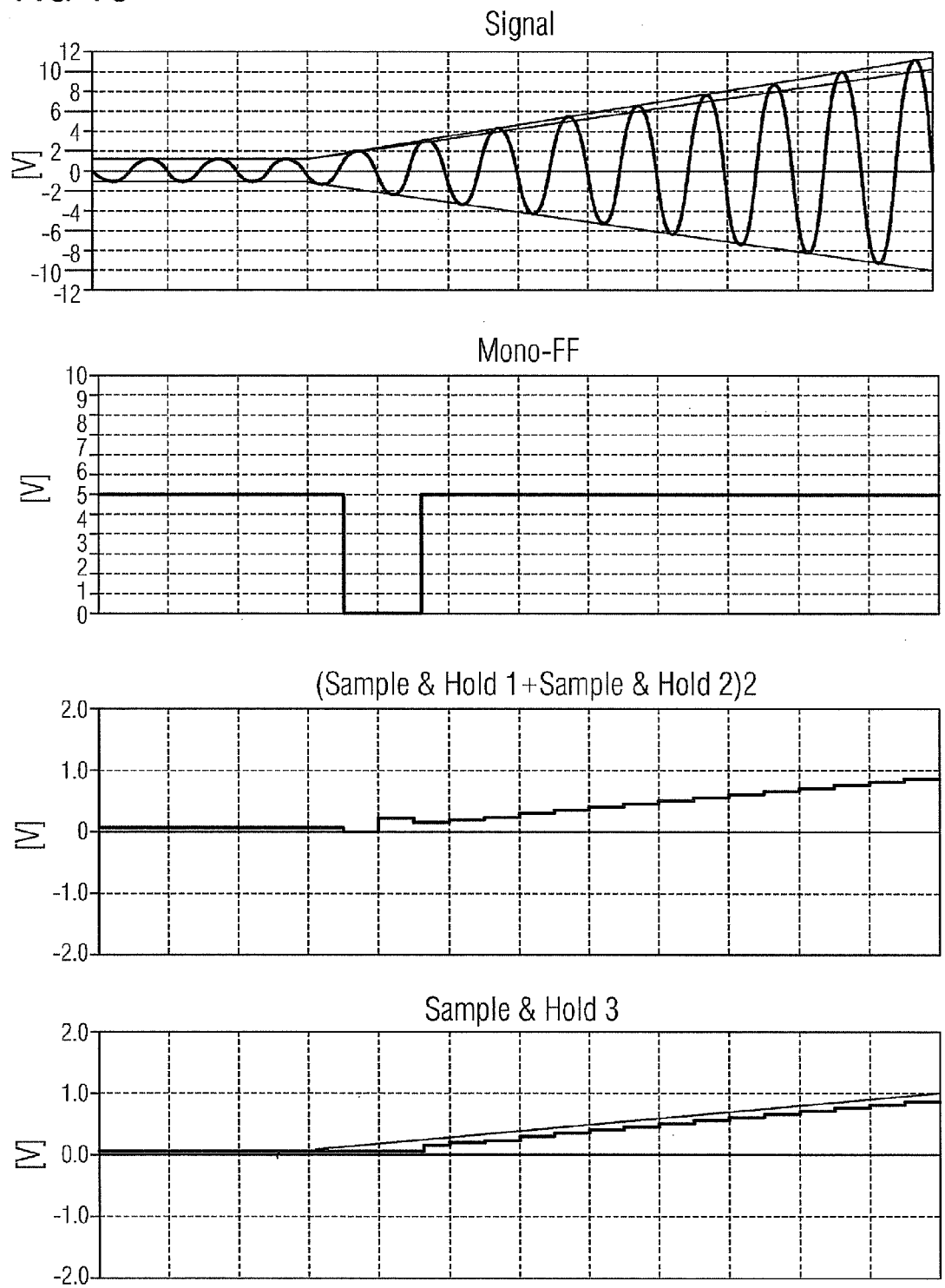
FIG. 13 shows a simulation of the signal curves in an offset determination circuit according to the method shown in FIG. 7 for an input signal with rising amplitude and offset of 10% of the amplitude.

FIG. 13 shows a typical schematic diagram of the simulation of the signal curves in an offset determination circuit according to FIG. 12 for an input signal ES with rising amplitude and an offset of 10% of the amplitude. An input signal ES is shown which exhibits an offset of 10% of the amplitude and, as from a point in time, represents a level rising at a constant rate.

The output signal of the timer 800 (Mono Flip Flop) shows a constant value at the beginning of the level increase of the input signal and, at the time of the level increase of the input signal ES, returns for a period of time determined by this timer 800 to the value zero. This means that the acceptance and storage of new input levels are blocked by the third memory unit 303 for this period determined by the timer 800 and that the output signal DC, output up to the time of the increase in the level of the input signal ES representing the offset of the input signal ES, continues to be output for this period of time determined by timer 800.

Figure 14:
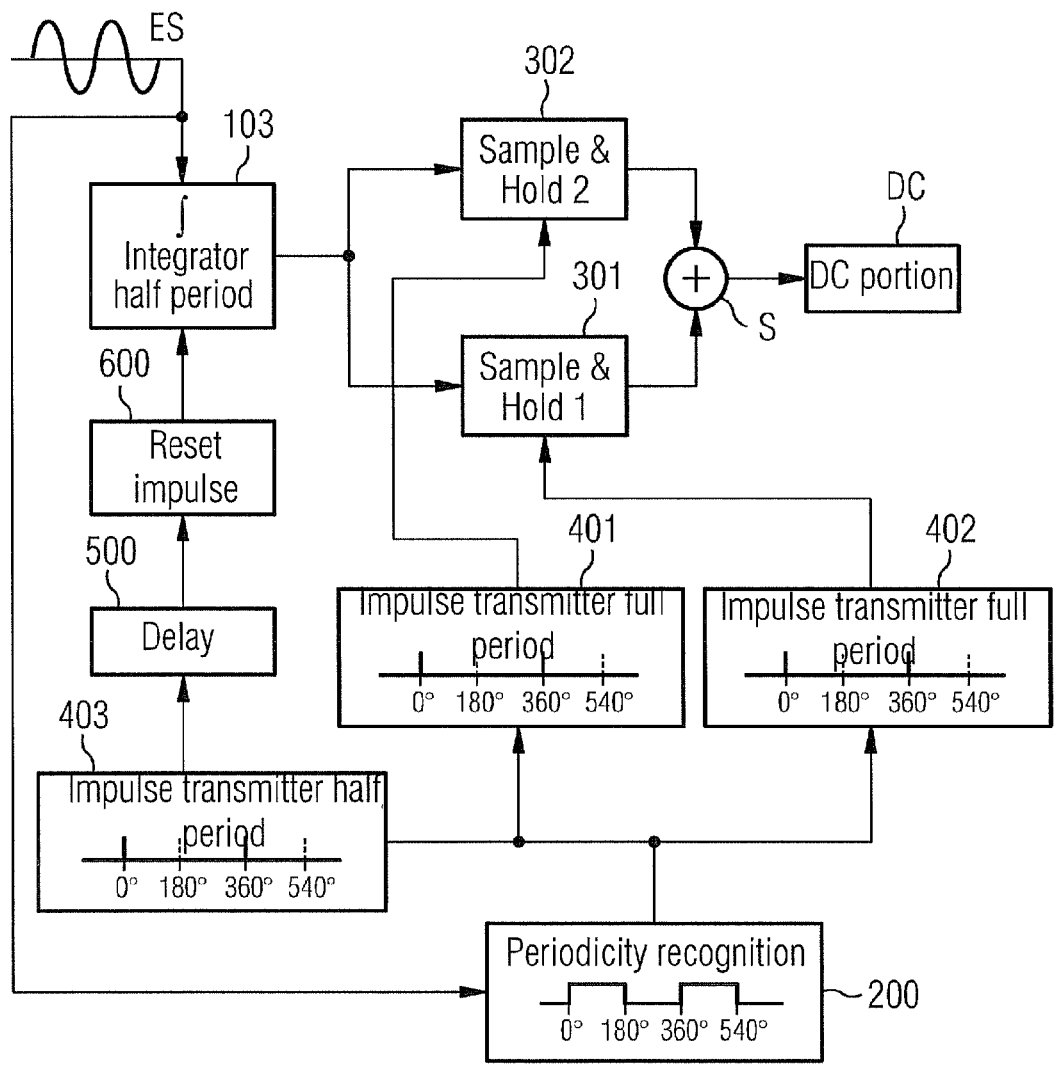
FIG. 14 shows a block diagram of an offset determination circuit according to the half-wave integration method.

FIG. 14 shows a typical schematic block diagram of an offset determination circuit according to the half-wave integration method.

An input signal ES is fed to the inputs of an integrator 103 and of a periodicity recognition unit 200. The integrator 103 integrates the input signal ES in each case for a half period of the input signal ES and is reset (cleared) immediately after the end of each half period. The output signal of the integrator 103 is fed to two memory devices 301, 302 and stored by these memory devices 301, 302, whereby one memory device 302 stores the output signal of the integrator 103 at the point in time at which each full period begins and the second memory device 301 stores the output signal of the integrator 103 at the point in time at which each full period of the input signal ES offset by a half period begins. The levels stored in the two memory devices 301, 302 are added in a summation circuit S, this sum signal DC represents the offset of the input signal ES. The memory devices 301, 302 are activated by means of two impulse transmitters 401, 402, whereby one impulse transmitter 401, at each beginning of each full period of the input signal ES, activates the memory device 302 assigned to it and the second impulse transmitter 402, at the beginning of each full period offset from this period by a half period, activates the memory device 301 assigned to it. An impulse transmitter 403 resets the integrator 103 by means of a delay circuit 500 and a reset impulse transmitter 600 immediately after the end of each half period (clears the level stored in the integrator 103).

Figure 15:
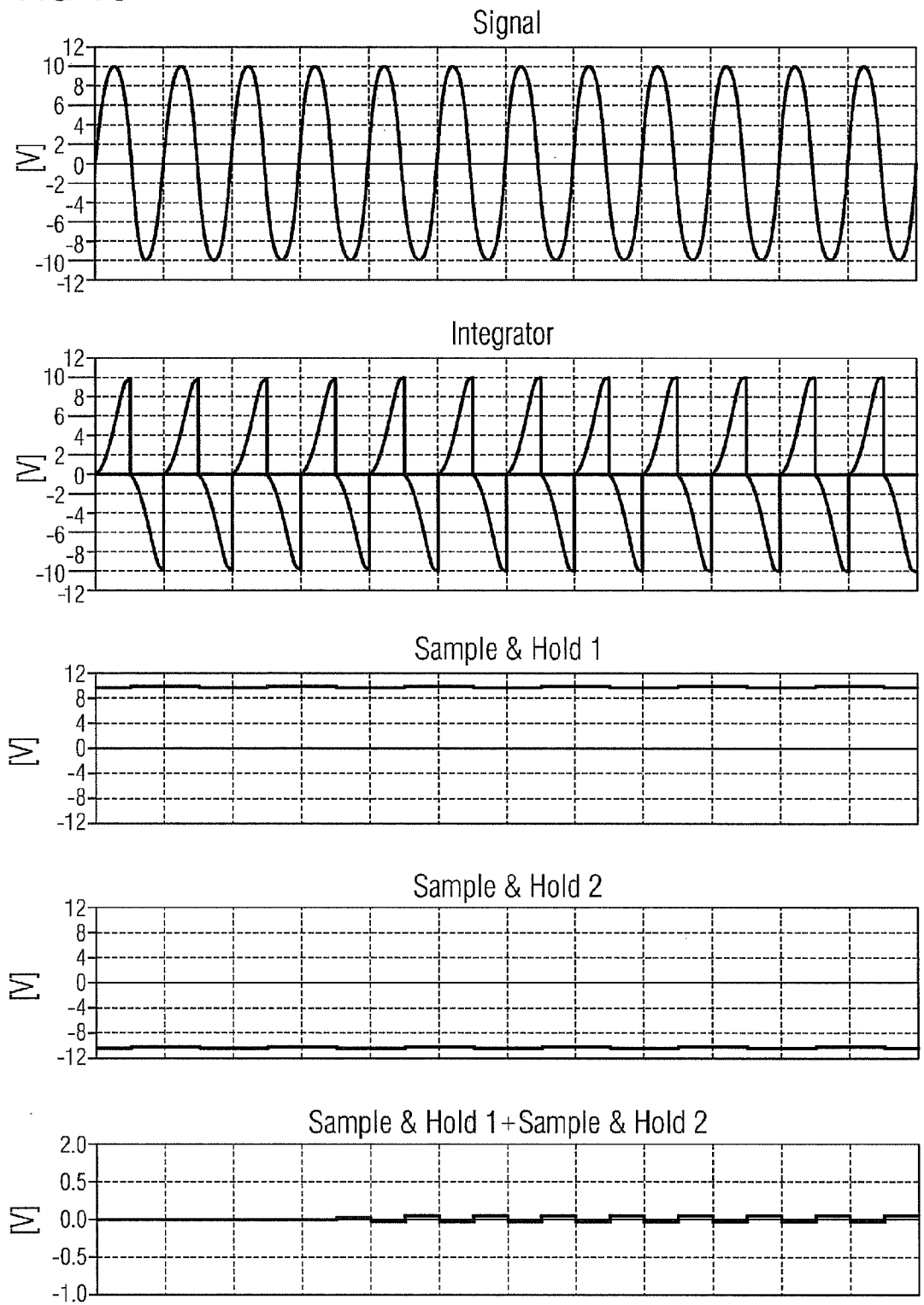
FIG. 15 shows a simulation of the signal curves in an offset determination circuit according to the half-wave integration method for an input signal without offset.

FIG. 15 shows a typical schematic diagram of the simulation of the signal curves in an offset determination circuit in accordance with the half-wave integration method according to FIG. 14 for an input signal ES without offset.

The output signal of integrator 103 represents the integral of the input signal ES, whereby after each half period the integrator 103 is reset. The two memory devices 301, 302 store the respective results of the integration processes of the two half periods. In the actual case of a sinusoidal input signal ES without offset the two integration results of the two half periods are of the same amount but opposite polarity. The summation signal DC representing the offset (Sample&Hold1+Sample&Hold2) thus has the value zero, with minimal fluctuations of this signal occurring through the inevitable time delays between the storage times and the clearing times of the integrator 103.

Figure 16:
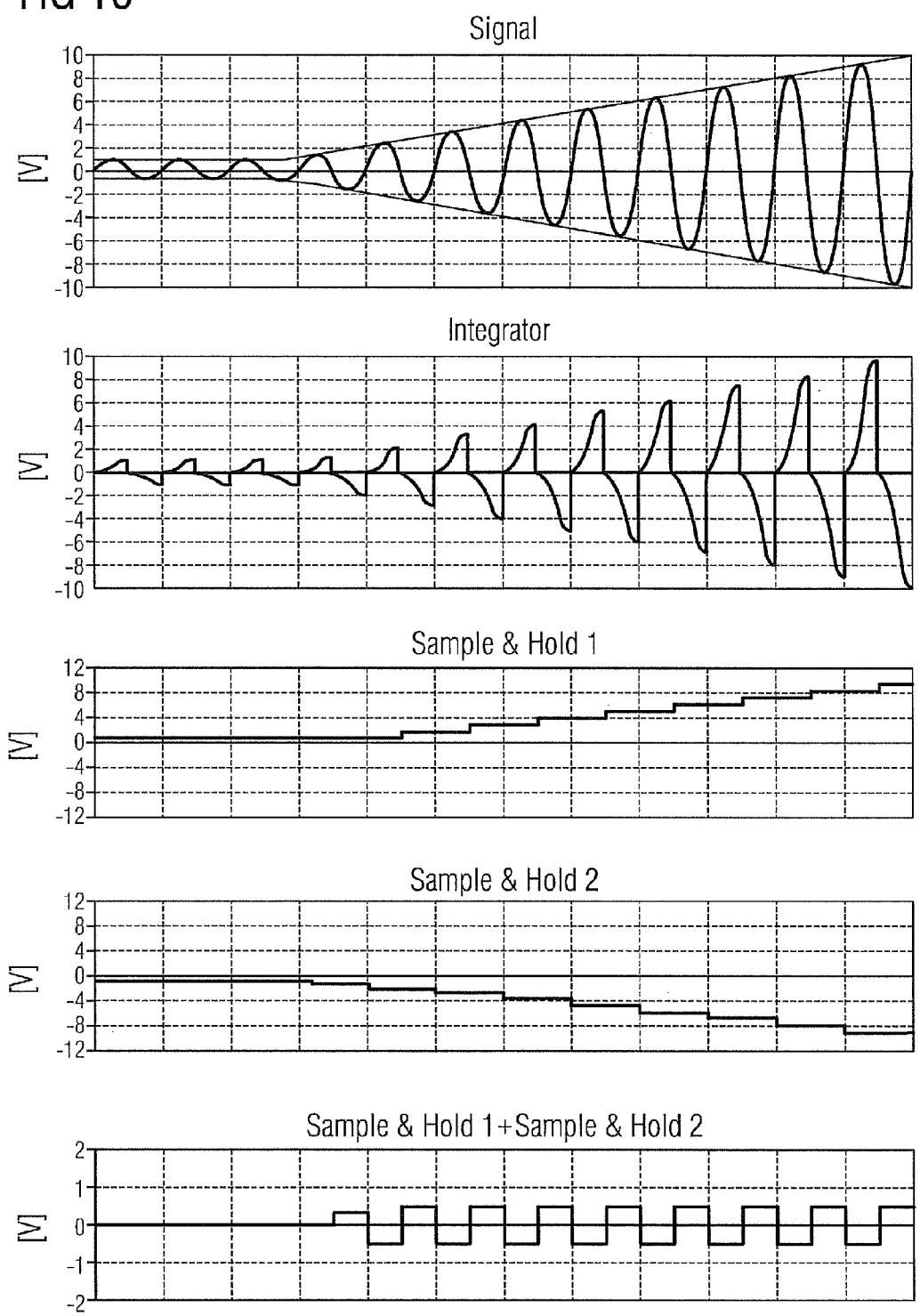
FIG. 16 shows a simulation of the signal curves in an offset determination circuit according to the half-wave integration method for an input signal with rising amplitude without offset.

FIG. 16 shows a typical schematic diagram of the simulation of the signal curves in an offset determination circuit in accordance with the half wave integration method according to FIG. 14 for an input signal ES with rising amplitude without offset.

An input signal ES is shown which, as from a point in time, exhibits a level rising at a constant rate.

In this case the sum signal DC (Sample&Hold1+Sample&Hold2) representing the offset of the input signal, as from the time of the beginning of the rise in level of the input signal ES, represents a rectangular shape with the frequency of the input signal ES.

Figure 17:
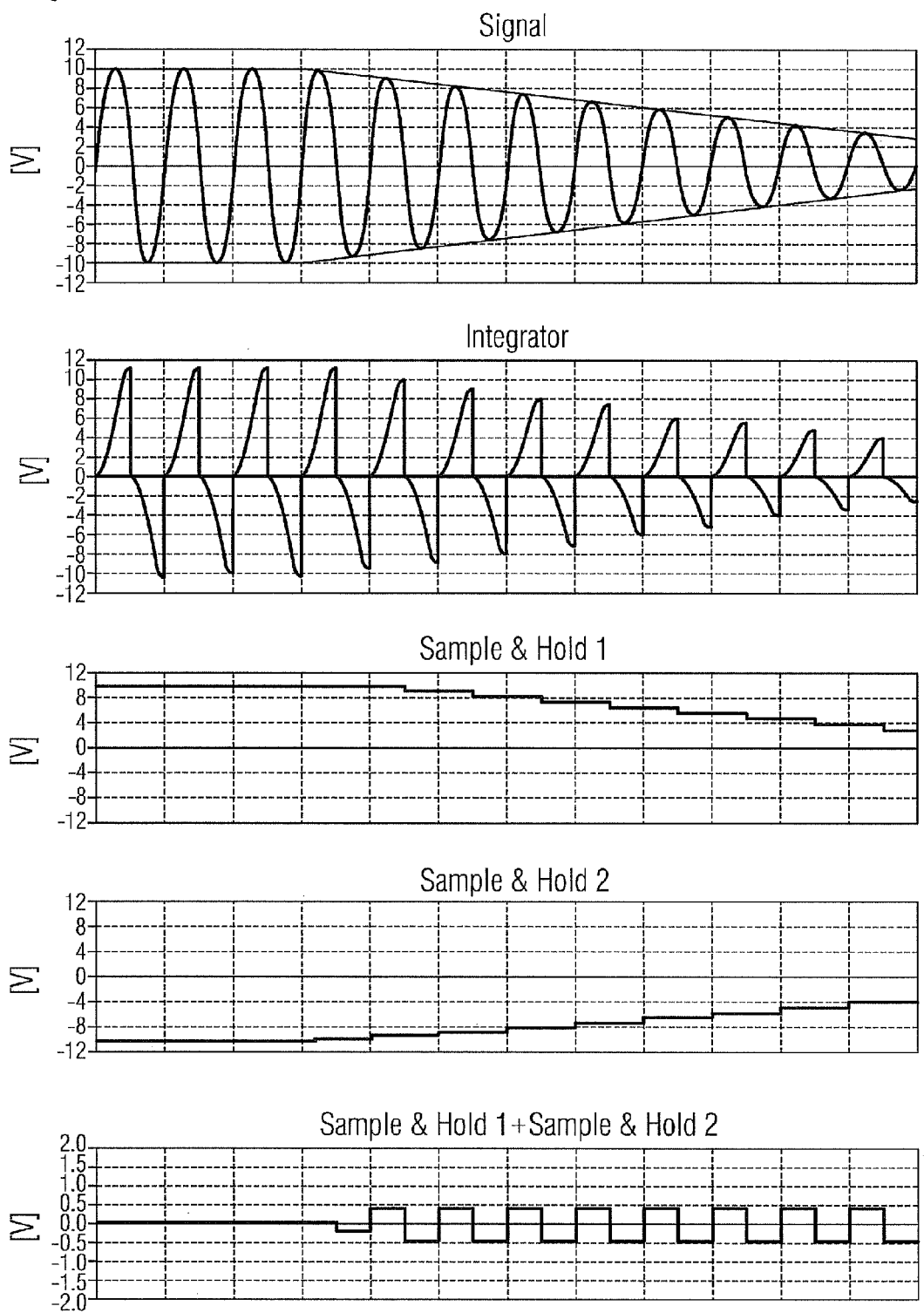
FIG. 17 shows a simulation of the signal curves in an offset determination circuit according to the half-wave integration method for an input signal with falling amplitude without offset.

FIG. 17 shows a typical schematic diagram of the simulation of the signal curves in an offset determination circuit in accordance with the half wave integration method according to FIG. 14 for an input signal ES with falling amplitude without offset.

An input signal ES is shown which, as from a point in time, exhibits a level falling at a constant rate.

In this case the sum signal DC (Sample&Hold1+Sample&Hold2) representing the offset of the input signal, as from the time of the beginning of the rise in level of the input signal ES, represents a rectangular shape with the frequency of the input signal ES. The phase position of this rectangular signal, in relation to the signal curve shown in FIG. 16, is offset by a half period duration of the input signal ES.

Figure 18:
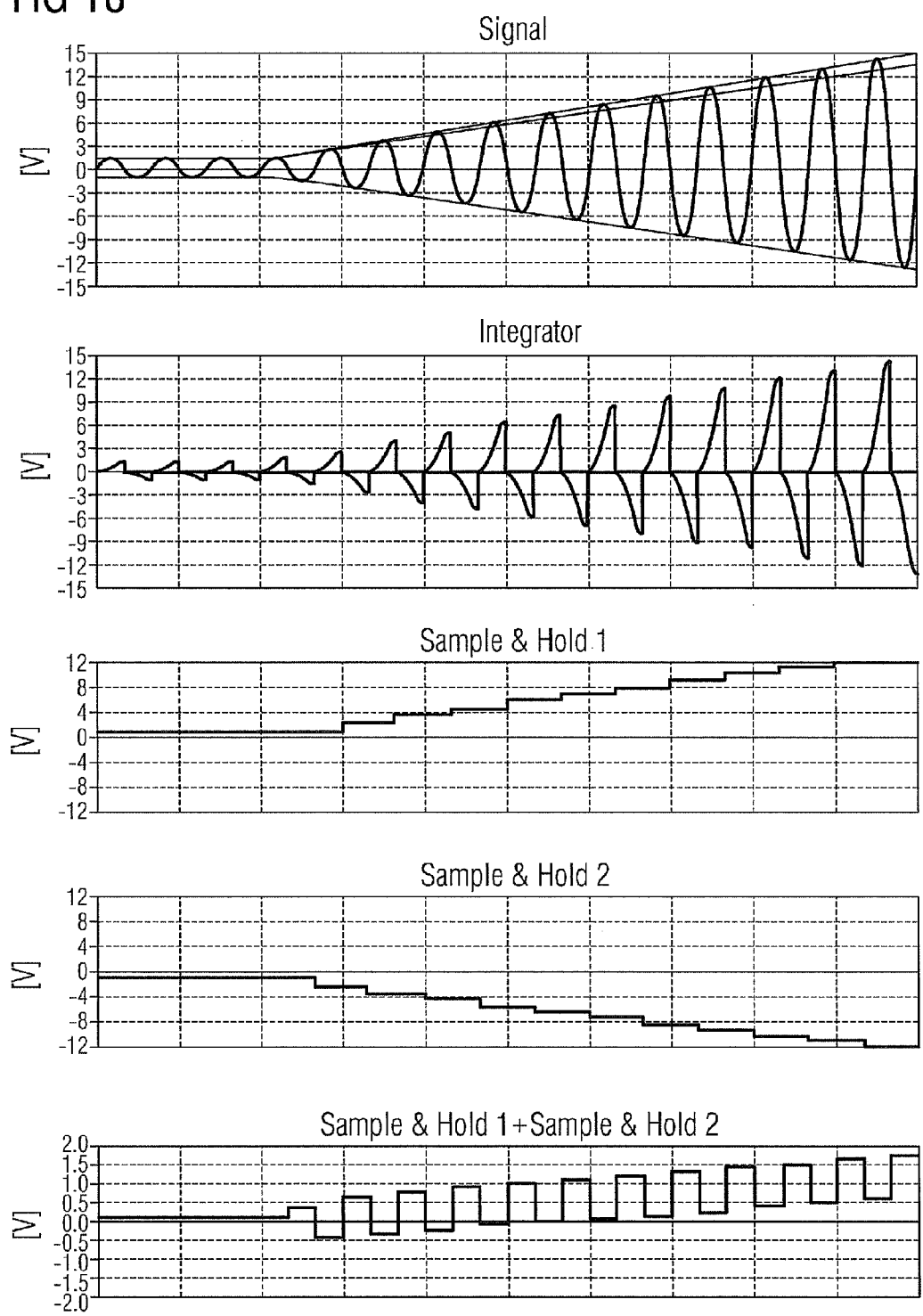
FIG. 18 shows a simulation of the signal curves in an offset determination circuit according to the half-wave integration method for an input signal with rising amplitude and offset of 10% of the amplitude.

FIG. 18 shows a typical schematic diagram of the simulation of the signal curves in an offset determination circuit in accordance with the half wave integration method according to FIG. 14 for an input signal ES with rising amplitude and offset of 10% of the amplitude.

An input signal ES is shown which exhibits than offset a 10% of the amplitude and, as from a point in time, exhibits a level rising at a constant rate.

In this case the summation signal DC (Sample&Hold1+Sample&Hold2) representing the offset of the input signal the exhibits a rectangular shape which is offset in level by the corresponding value of the offset of the input signal ES.

Figure 19:
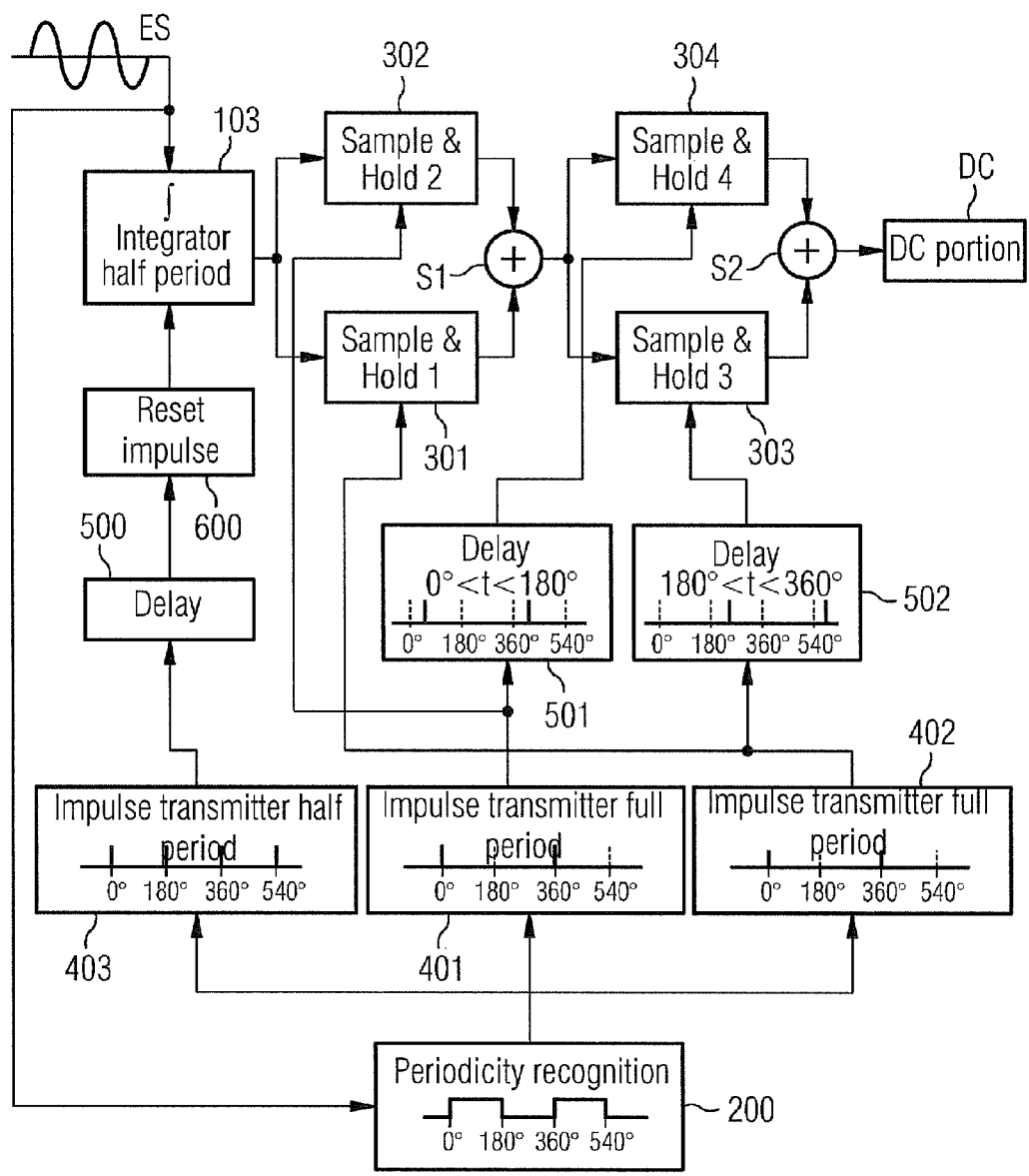
FIG. 19 shows a block diagram of an inventive offset determination circuit according to a half-wave integration method with two additional memory devices.

FIG. 19 shows a typical schematic block diagram of an inventive offset determination circuit in accordance with the half-wave integration method with two additional memory devices.

In FIG. 19 the circuit shown FIG. 14 in accordance with the half-wave integration method is expanded by two further memory devices 303, 304, two delay circuits 501, 502 and a summation circuit S2. The output signal DC representing the offset of the input signal ES is fanned by means of the further summation circuit S2 from the output signals of the further memory devices 303, 304 (Sample&Hold 3, Sample&Hold 4). The input signals of the two further memory devices 303, 304 (Sample&Hold 3, Sample&Hold 4) are formed by the signal formed by the summation of the output signals of the two memory devices 301, 302 (Sample&Hold 1, Sample&Hold 2). One of the further memory devices 304 is activated in each period of the input signal ES of the offset determination circuit at a given point in time within the first half period of the input signal ES of the offset determination circuit and stores its assigned input signal at this point in time. The other of the two memory devices 303 is activated at a point in time offset from this point in time (in the second half period) by one half period of the input signal ES of the offset determination circuit and stores its assigned input signal at this point in time. The further memory devices 303, 304 (Sample&Hold 3, Sample&Hold 4) are activated by two delays circuits 501, 502 which are each activated by one of the impulse generators 401, 402.

Figure 20:
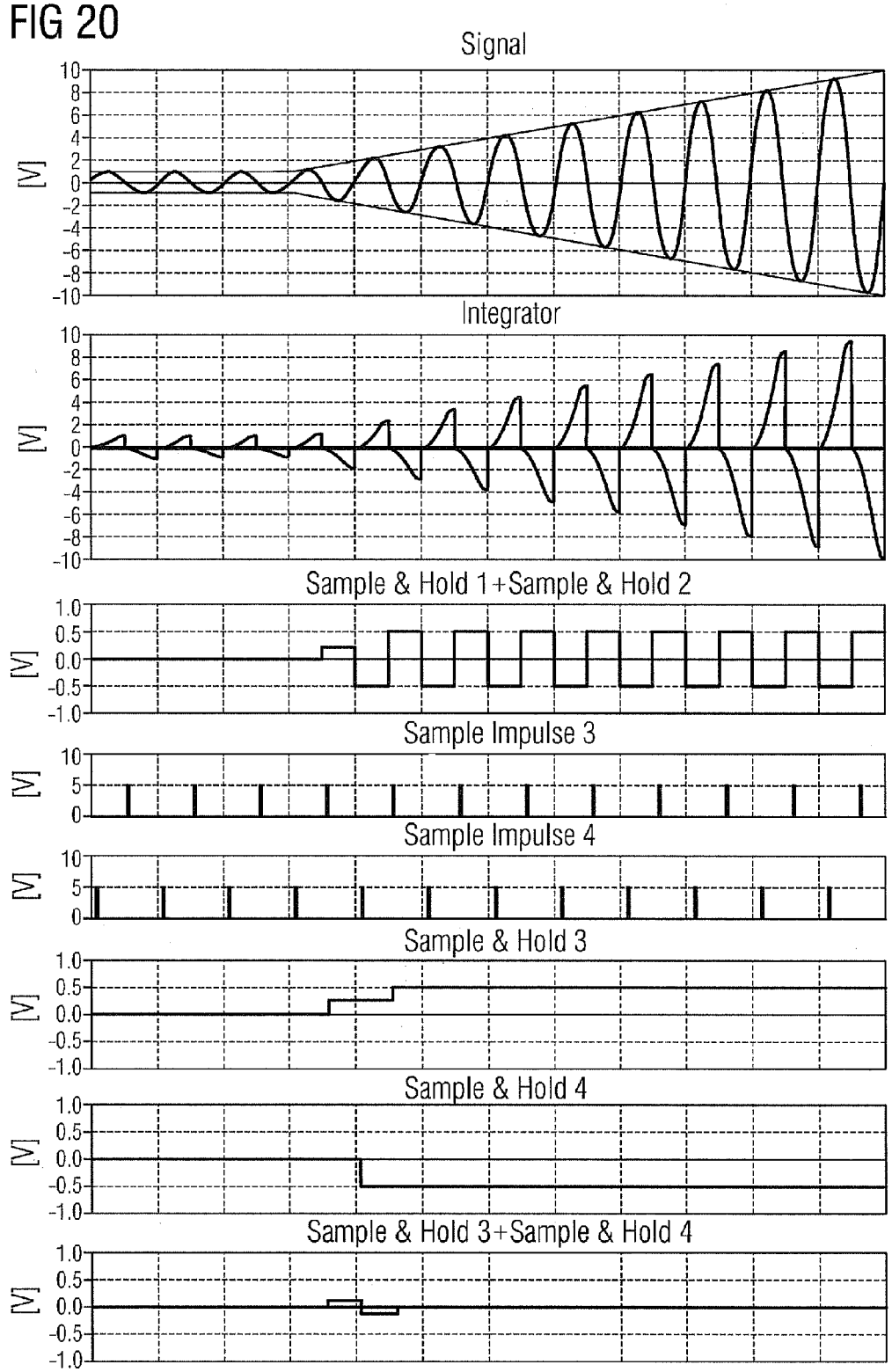
FIG. 20 shows a simulation of the signal curves in an inventive offset determination circuit according to a half-wave integration method with two additional memory devices for an input signal with rising amplitude.

FIG. 20 shows a typical schematic diagram of the simulation of the signal curves in of an inventive offset determination circuit according to a half-wave integration method with two additional memory devices according to FIG. 19 for an input signal ES with rising amplitude.

A sinusoidal periodic input signal ES is shown, which as from a point in time, exhibits a level rising at a constant rate.

The signal formed by summation of the output signals of the two memory devices 301, 302 (Sample&Hold 1, Sample&Hold 2), as in the signal shown the circuit in accordance with FIG. 14, has a square waveform. The output signal DC of the offset determination circuit according to a half-wave integration method with two additional memory devices, which is formed by summation of the two further memory devices 303, 304 (Sample&Hold 3, Sample&Hold 4) has the value zero except for a short synchronization phase.

Figure 21:
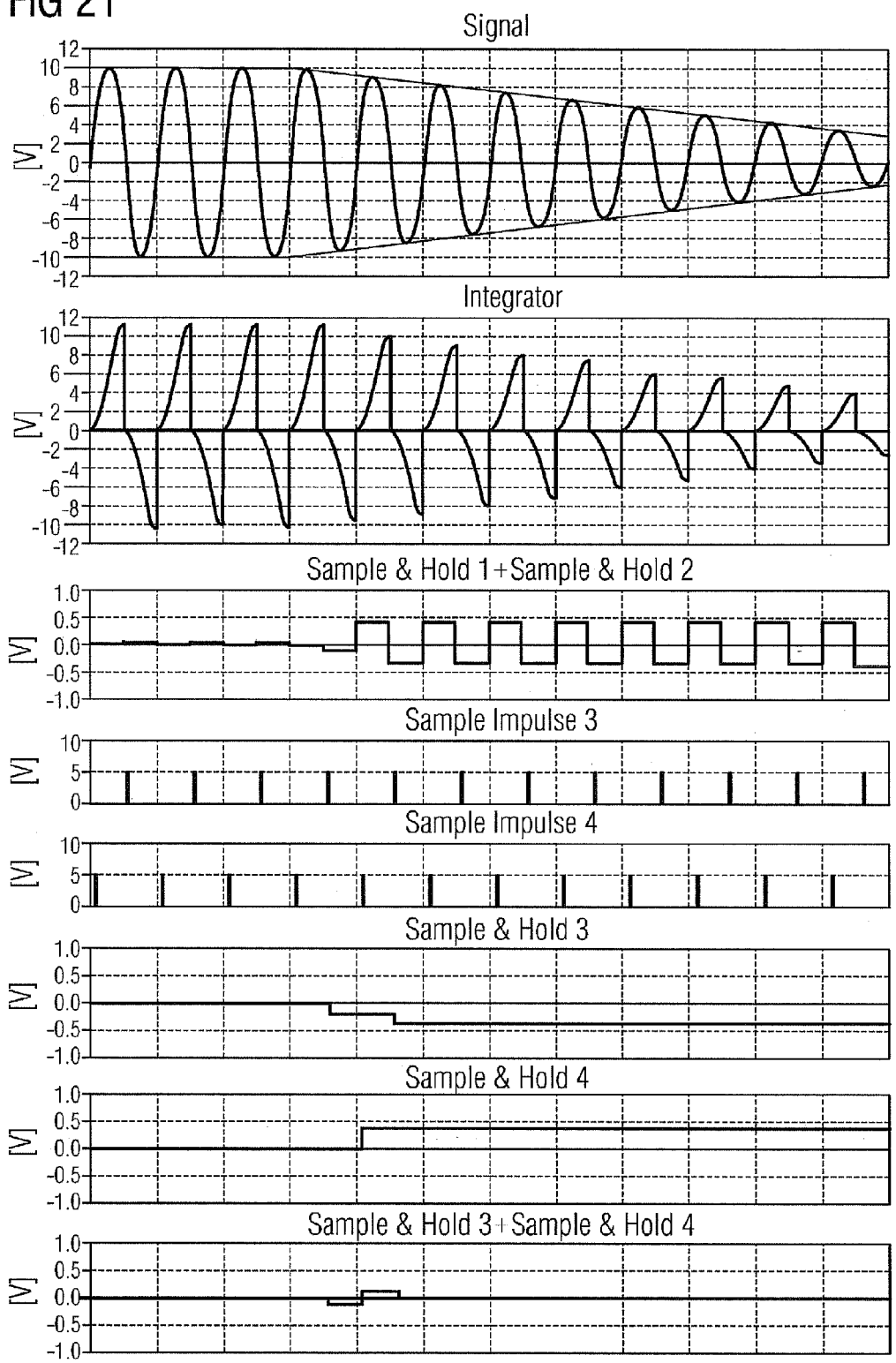
FIG. 21 shows a simulation of the signal curves in an inventive offset determination circuit according to a half-wave integration method with two additional memory devices for an input signal with falling amplitude.

FIG. 21 shows a typical schematic diagram of the simulation of the signal curves in an inventive offset determination circuit according to a half-wave integration method with two additional memory devices in accordance with FIG. 19 for an input signal ES with falling amplitude. A sinusoidal periodic input signal ES is shown, which as from a point in time, exhibits a level falling at a constant rate. In this case the output signal DC of the offset determination circuit according to a half-wave integration method with two additional memory devices, which is formed by summation of the two further memory devices 303, 304 (Sample&Hold 3, Sample&Hold 4) has the value zero except for a short synchronization phase.

Figure 22:
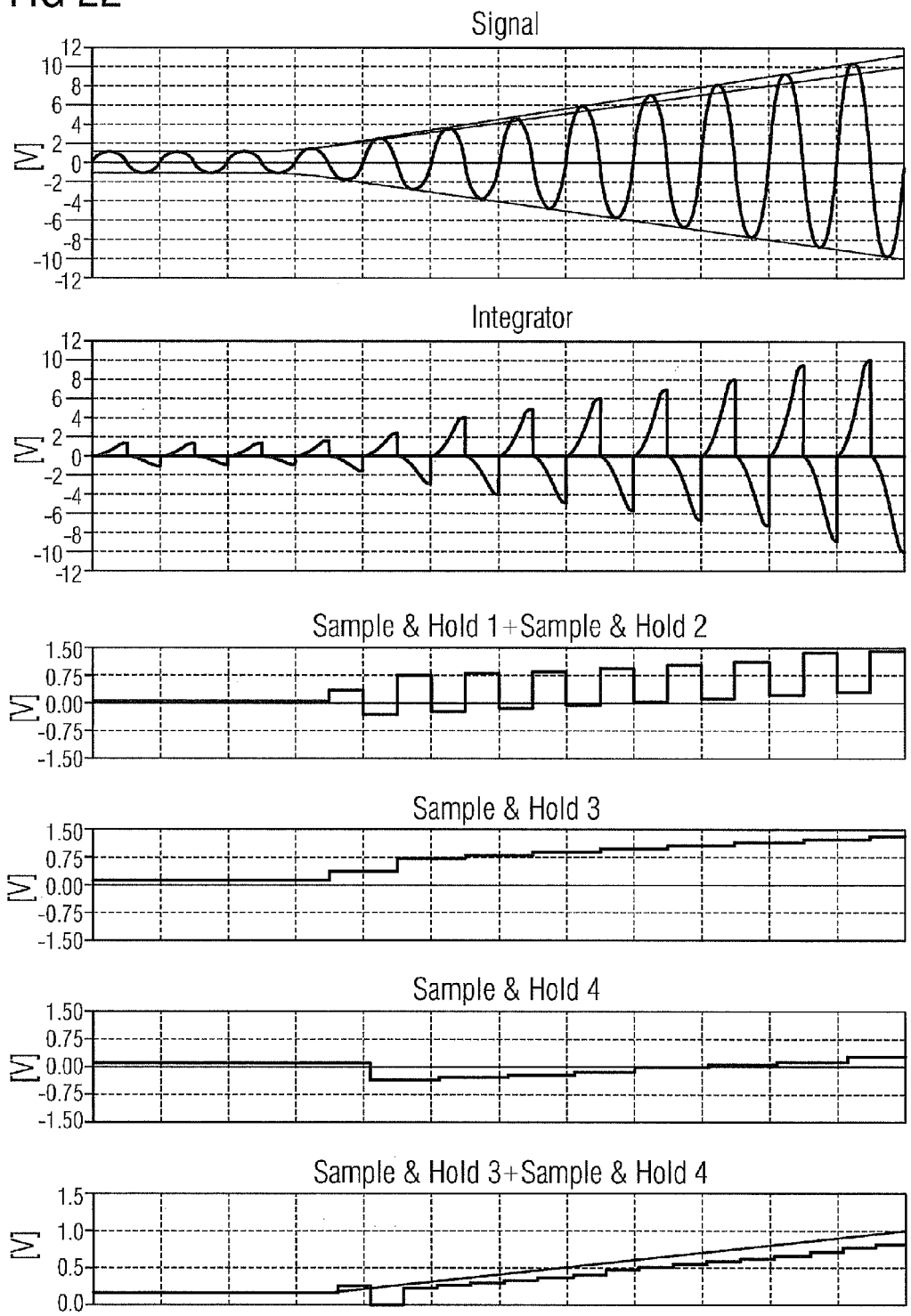
FIG. 22 shows a simulation of the signal curves in an inventive offset determination circuit according to a half-wave integration method with two additional memory devices for an input signal with rising amplitude and offset of 10% of the amplitude.

FIG. 22 shows a typical schematic diagram of the simulation of the signal curves in an inventive offset determination circuit according to a half-wave integration method with two additional memory devices according to FIG. 19 for an input signal ES with rising amplitude and an offset of 10% of the amplitude.

The output signal DC, which is formed by a summation of the two further memory devices 303, 304 (Sample&Hold 3, Sample&Hold 4), except for a short synchronization phase, follows the value of the offset of the input signal ES.

Figure 23:
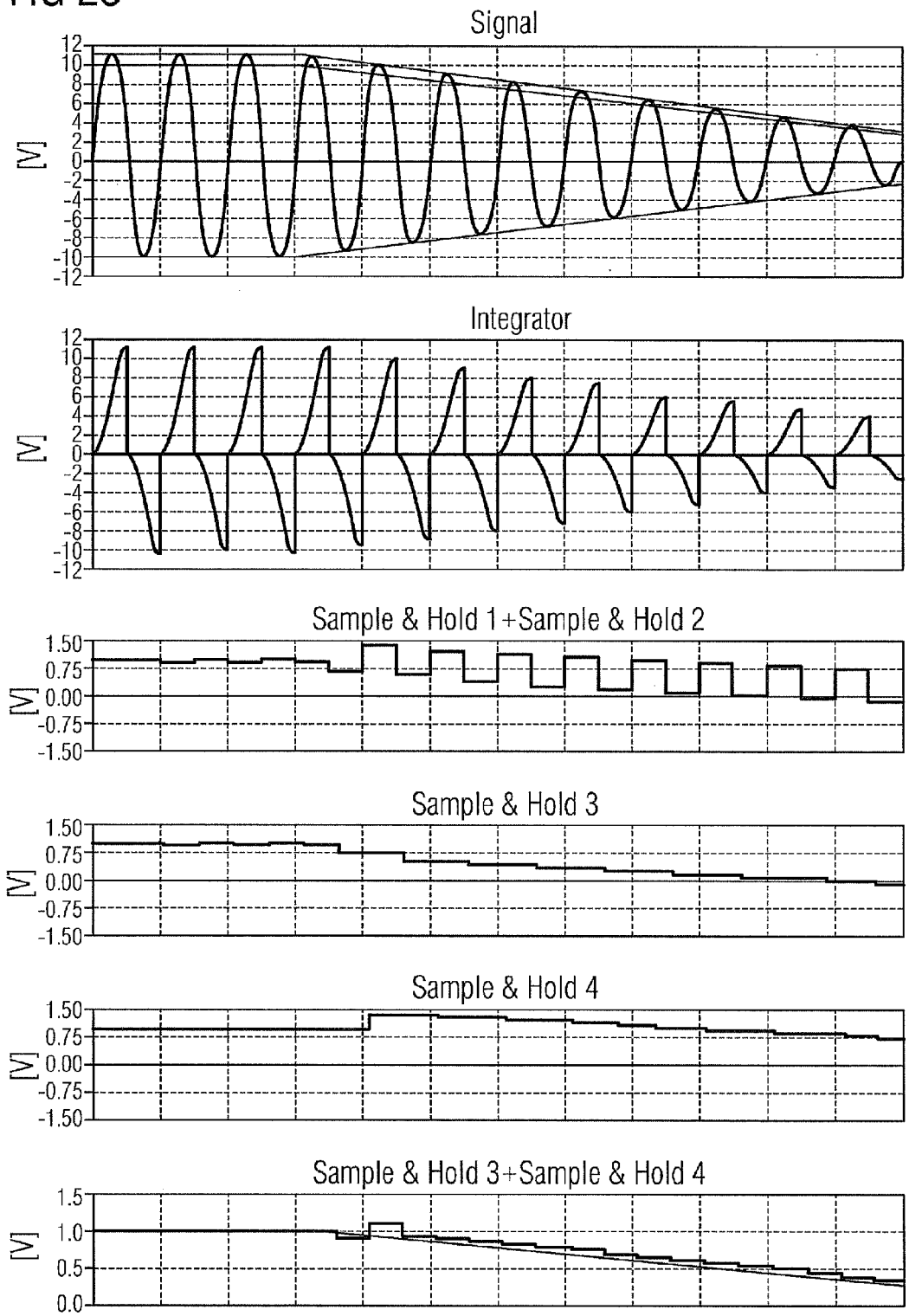
FIG. 23 shows a simulation of the signal curves in an inventive offset determination circuit according to a half-wave integration method with two additional memory devices for an input signal with falling amplitude and offset of 10% of the amplitude.

FIG. 23 shows a typical schematic diagram of the simulation of the signal curves in an inventive offset determination circuit according to a half-wave integration method with two additional memory devices according to FIG. 19 for an input signal ES with falling amplitude and an offset of 10% of the amplitude.

The output signal DC, which is formed by a summation of the two further memory devices 303, 304 (Sample&Hold 3, Sample&Hold 4), except for a short synchronization phase, follows the value of the offset of the input signal ES.

Figure 24:
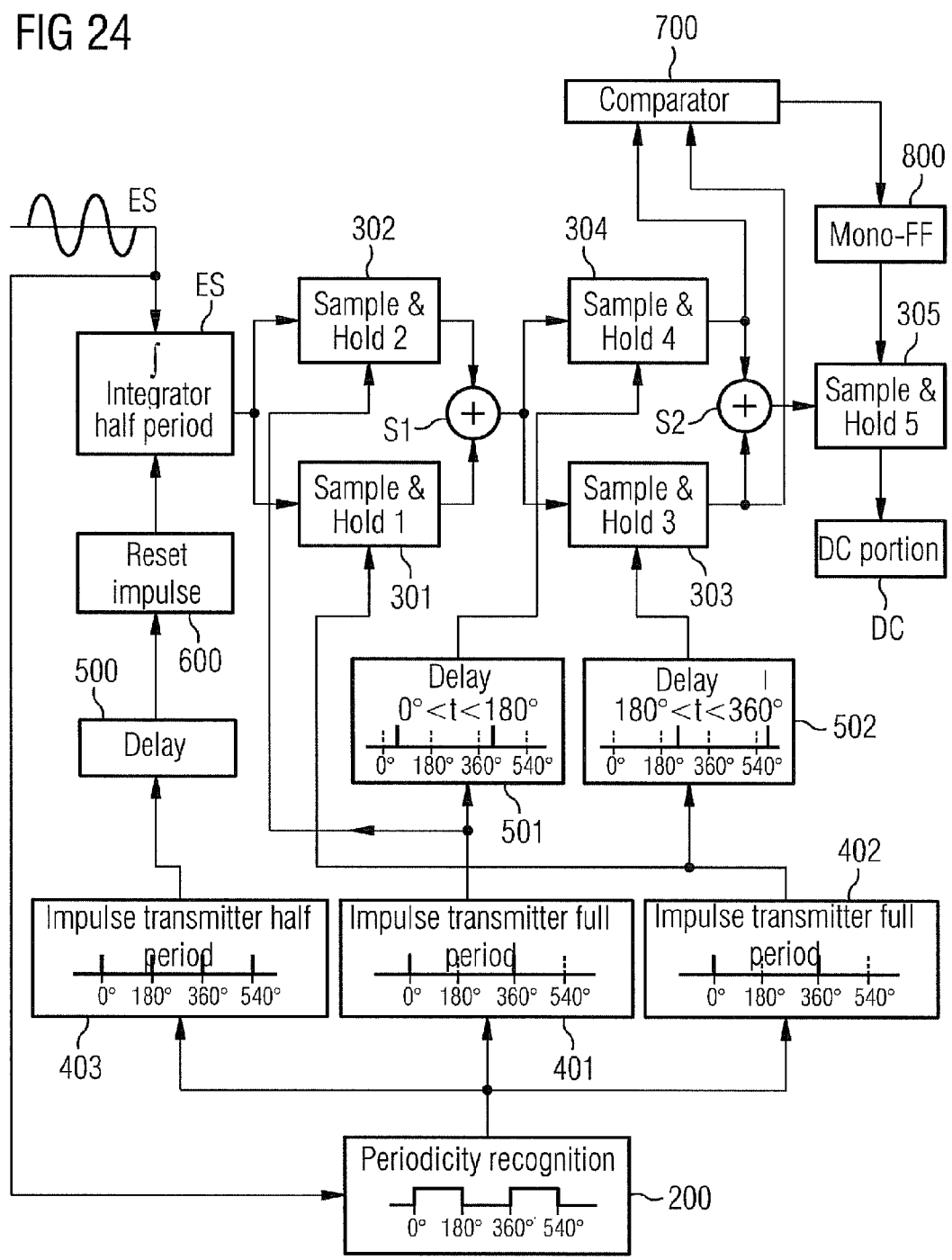
FIG. 24 shows a block diagram of an inventive offset determination circuit as in FIG. 19, expanded by means for suppressing the synchronization impulse.

FIG. 24 shows a typical schematic block diagram of an inventive offset determination circuit in accordance with the half-wave integration method with two additional memory devices as in FIG. 19, expanded by means for suppressing the synchronization impulse.

Figure 25:
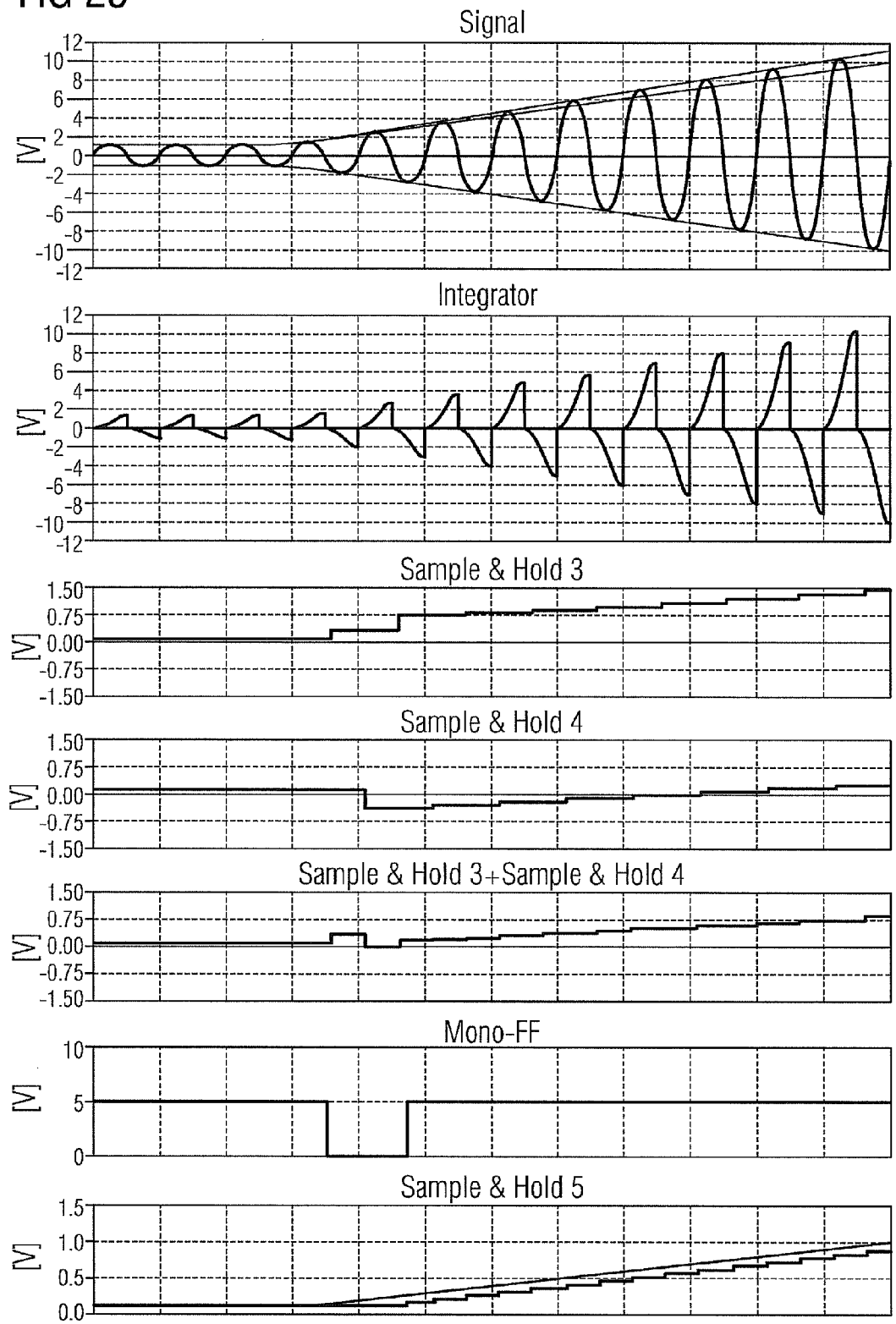
FIG. 25 shows a simulation of the signal curves in an inventive offset determination circuit as in FIG. 24 for an input signal with rising amplitude and offset of 10% of the amplitude.

FIG. 25 shows a typical schematic diagram of the simulation of the signal curves in an inventive offset determination circuit according to a half-wave integration method with two additional memory devices and means for suppressing the synchronization impulse in accordance with FIG. 19 for an input signal ES with rising amplitude and an offset of 10% of the amplitude.

The invention claimed is:

1. A method of determining an offset of a periodic signal, comprising:
    feeding the periodic signal to a first and a second integrator and to a periodicity recognition unit;
    integrating the first integrator over a full period;
    integrating the second integrator over a full period offset by a half period;
    controlling starting times of the integrating of the first and second integrators by the periodicity recognition unit;
    storing output signals of the two intergrators after a period duration in two memory devices;
    summing the output signals in a sum signal, wherein the sum signal represents the offset of the periodic signal, suppressing a synchronization phase;
    feeding the output signals of the two memory devices each assigned to one of the integrators to a comparator circuit; and
    storing the sum signal of the output signals of the two memory devices in a further memory device, the sum signal being held as an output signal,
    wherein the comparator circuit, on an occurrence of different amounts of the output signals of the two memory devices, triggers the further memory device to continue outputting for a specific period of time a value of the output signal stored in the further memory device.

2. The method as claimed in claim 1, wherein a timer unit is provided, and wherein the further memory device is triggered by the timer unit.

3. A half-wave method for determining an offset of a periodic signal, whereby the periodic signal is fed to an integrator and to a periodicity recognition unit, and wherein the integrator integrates the periodic signal over a half period, the method comprising:
    feeding an output signal of the integrator to a first Sample&Hold memory device and storing a first output signal value in the first Sample&Hold memory device at the beginning of each full period of the periodic signal;
    feeding the output signal of the integrator to a second Sample&Hold memory device and storing second output signal value in the second Sample&Hold memory device at the beginning of each full period of the periodic signal offset by a half period duration;
    summing the first and second output signal values in a first summation with a first summation signal value;
    feeding the first summation signal value to a third Sample&Hold memory device and storing the first summation signal value in the third Sample&Hold memory device at the beginning of each full period of the periodic signal offset by a period between zero and a half period duration;
    feeding the first summation signal value to a fourth Sample&Hold memory device and storing the first summation signal value in the fourth Sample&Hold memory device at the beginning of each full period of the periodic signal offset by a period of between a half and a whole period duration; and
    summing the first summation signal values in a second summation and outputting a second summation signal value as an offset of the periodic input signal.

4. A half-wave method for determining an offset of a periodic signal with suppression of a synchronization phase, whereby the periodic signal is fed to an integrator and to a periodicity recognition unit, and wherein the integrator integrates the periodic signal over a half period, the method comprising:
    feeding an output signal of the integrator to a first Sample&Hold memory device and storing a first signal value in the first Sample&Hold memory device at the beginning of each full period of the periodic signal;
    feeding the output signal of the integrator to a second Sample&Hold memory device and storing a second signal value in the second Sample&Hold memory device at the beginning of each full period of the periodic signal offset by a half period;
    summing the first and second signal values in a first summation;
    feeding the first summation of the first and second signal values to a third Sample&Hold memory device and storing a first summation signal value in the third Sample&Hold memory device at the beginning of each full period of the periodic signal offset by a period of between a half and a whole period duration;
    feeding the first summation signal value to a fourth Sample&Hold memory device and storing the first summation signal value in the fourth Sample&Hold memory device at the beginning of each full period of the periodic signal offset by a period of between a half and a whole period duration;
    summing the first summation signal values in a second summation and feeding a second summation signal value to a fifth Sample&Hold memory device and storing the second summation signal value in the fifth Sample&Hold memory device;
    feeding the first summation of the first and second signal values stored in the third Sample&Hold memory device and the first summation signal value stored in the fourth Sample&Hold memory device to a comparator circuit and triggering of a timer by the comparator circuit for different levels of the signal values stored in the third and fourth memory devices;
    outputting the second summation signal value stored in the fifth Sample&Hold memory device as an offset value of the periodic signal, whereby, while the timer is running, a storage of new signal values in the fifth memory device will be suppressed and a last signal value stored before the timer begins to run continues to be output while the timer is running as the offset value of the periodic signal.

* * * * *